US012776761B2

(12) United States Patent
Toroker et al.

(10) Patent No.: US 12,776,761 B2
(45) Date of Patent: Oct. 27, 2026

(54) CLOCK ADJUSTMENT CIRCUIT WITH BIAS SCHEME

(71) Applicant: Intel Products IP LLC, Santa Clara, CA (US)

(72) Inventors: Zeev Toroker, Haifa (IL); Daljeet Kumar, New Delhi (IN); Yevgeny Perelman, Haifa (IL)

(73) Assignee: Intel Products IP LLC, Santa Clara, CA (US)

( * ) Notice: Subject to any disclaimer, the term of this patent is extended or adjusted under 35 U.S.C. 154(b) by 0 days.

(21) Appl. No.: 18/086,822

(22) Filed: Dec. 22, 2022

(65) Prior Publication Data

US 2024/0213961 A1 Jun. 27, 2024

(51) Int. Cl.

| | |
|---|---|
| ***H03K 3/00*** | (2006.01) |
| ***H03K 3/017*** | (2006.01) |
| ***H03K 5/05*** | (2006.01) |
| *H03K 5/00* | (2006.01) |

(52) U.S. Cl.

CPC ............... *H03K 3/017* (2013.01); *H03K 5/05* (2013.01); *H03K 2005/00026* (2013.01)

(58) Field of Classification Search

CPC .......... H03K 2005/00019; H03K 2005/00221; H03K 5/13; H03K 5/131; H03K 5/133; H03K 5/134; H03K 2005/00026; H03K 3/017; H03K 5/05

See application file for complete search history.

(56) References Cited

U.S. PATENT DOCUMENTS

| | | | | |
|---|---|---|---|---|
| 5,440,260 | A * | 8/1995 | Hayashi | H03K 5/133 327/281 |
| 6,304,124 | B1 * | 10/2001 | Mizuno | H03K 5/131 327/276 |
| 6,664,837 | B1 * | 12/2003 | Oh | H03K 5/133 327/272 |
| 9,711,189 | B1 * | 7/2017 | Wang | G11C 29/028 |
| 2007/0273416 | A1 * | 11/2007 | Heyne | H03L 7/07 327/158 |
| 2008/0174350 | A1 * | 7/2008 | Shin | H03L 7/0816 327/158 |
| 2009/0278580 | A1 * | 11/2009 | Kim | H03K 5/13 327/158 |
| 2014/0103985 | A1 * | 4/2014 | Andreev | H03K 5/131 327/262 |

(Continued)

FOREIGN PATENT DOCUMENTS

JP 61-52022 * 3/1986

*Primary Examiner* — Tuan T Lam

(74) *Attorney, Agent, or Firm* — Schwegman Lundberg & Woessner P.A.

(57) ABSTRACT

Some embodiments include apparatuses comprising a first node; a second node; a first transistor and a second transistor, the first and second transistors including a common gate coupled to the node and a common terminal coupled to the second node; first additional transistors coupled in parallel with each other between a terminal of the first transistor and a first supply node, the first additional transistors including gates; and second additional transistors coupled in parallel with each other between a terminal of the second transistor and a second supply node, the second additional transistors including gates.

23 Claims, 8 Drawing Sheets

(56) References Cited

U.S. PATENT DOCUMENTS

| | | | | |
|---|---|---|---|---|
| 2016/0056805 | A1* | 2/2016 | Kousai | H03K 5/131<br>327/276 |
| 2017/0364276 | A1* | 12/2017 | Bhuiyan | G11C 29/028 |
| 2022/0368332 | A1* | 11/2022 | Lin | H03L 7/0998 |

* cited by examiner

313P

| | $VPi_N \cdots VPi_0$ (N=4) | | | | |
|---|---|---|---|---|---|
| | $VPi_4$ | $VPi_3$ | $VPi_2$ | $VPi_1$ | $VPi_0$ |
| $SEL\_Pi_0$ | $VP_{TAP\_0}$ | $VP_{TAP\_0}$ | $VP_{TAP\_0}$ | $VP_{TAP\_0}$ | $VP_{TAP\_0}$ |
| $SEL\_Pi_1$ | $VP_{TAP\_0}$ | $VP_{TAP\_0}$ | $VP_{TAP\_0}$ | $VP_{TAP\_0}$ | $VP_{TAP\_1}$ |
| $SEL\_Pi_2$ | $VP_{TAP\_0}$ | $VP_{TAP\_0}$ | $VP_{TAP\_0}$ | $VP_{TAP\_1}$ | $VP_{TAP\_1}$ |
| ⋮ | $VP_{TAP\_0}$ | $VP_{TAP\_0}$ | $VP_{TAP\_1}$ | $VP_{TAP\_1}$ | $VP_{TAP\_1}$ |
| | $VP_{TAP\_0}$ | $VP_{TAP\_1}$ | $VP_{TAP\_1}$ | $VP_{TAP\_1}$ | $VP_{TAP\_1}$ |
| | $VP_{TAP\_1}$ | $VP_{TAP\_1}$ | $VP_{TAP\_1}$ | $VP_{TAP\_1}$ | $VP_{TAP\_1}$ |
| | $VP_{TAP\_2}$ | $VP_{TAP\_1}$ | $VP_{TAP\_1}$ | $VP_{TAP\_1}$ | $VP_{TAP\_1}$ |
| | $VP_{TAP\_2}$ | $VP_{TAP\_2}$ | $VP_{TAP\_1}$ | $VP_{TAP\_1}$ | $VP_{TAP\_1}$ |
| | $VP_{TAP\_2}$ | $VP_{TAP\_2}$ | $VP_{TAP\_2}$ | $VP_{TAP\_1}$ | $VP_{TAP\_1}$ |
| | $VP_{TAP\_2}$ | $VP_{TAP\_2}$ | $VP_{TAP\_2}$ | $VP_{TAP\_2}$ | $VP_{TAP\_1}$ |
| | $VP_{TAP\_2}$ | $VP_{TAP\_2}$ | $VP_{TAP\_2}$ | $VP_{TAP\_2}$ | $VP_{TAP\_2}$ |
| | $VP_{TAP\_2}$ | $VP_{TAP\_2}$ | $VP_{TAP\_2}$ | $VP_{TAP\_2}$ | $VP_{TAP\_3}$ |
| | $VP_{TAP\_2}$ | $VP_{TAP\_2}$ | $VP_{TAP\_2}$ | $VP_{TAP\_3}$ | $VP_{TAP\_3}$ |
| | $VP_{TAP\_2}$ | $VP_{TAP\_2}$ | $VP_{TAP\_3}$ | $VP_{TAP\_3}$ | $VP_{TAP\_3}$ |
| | $VP_{TAP\_2}$ | $VP_{TAP\_3}$ | $VP_{TAP\_3}$ | $VP_{TAP\_3}$ | $VP_{TAP\_3}$ |
| | $VP_{TAP\_3}$ | $VP_{TAP\_3}$ | $VP_{TAP\_3}$ | $VP_{TAP\_3}$ | $VP_{TAP\_3}$ |
| $SEL\_Pi_M$ | $VP_{TAP\_X}$ | $VP_{TAP\_X}$ | $VP_{TAP\_X}$ | $VP_{TAP\_X}$ | $VP_{TAP\_X}$ |

FIG. 3C

311N

| | $VN1_N \cdots VN1_0$ (N=4) | | | | | |
|---|---|---|---|---|---|---|
| | $VN1_4$ | $VN1_3$ | $VN1_2$ | $VN1_1$ | $VN1_0$ | |
| $SEL\_N1_0$ | $VN_{TAP\_0}$ | $VN_{TAP\_0}$ | $VN_{TAP\_0}$ | $VN_{TAP\_0}$ | $VN_{TAP\_0}$ | 340 |
| $SEL\_N1_1$ | $VN_{TAP\_0}$ | $VN_{TAP\_0}$ | $VN_{TAP\_0}$ | $VN_{TAP\_0}$ | $VN_{TAP\_1}$ | 341 |
| $SEL\_N1_2$ | $VN_{TAP\_0}$ | $VN_{TAP\_0}$ | $VN_{TAP\_0}$ | $VN_{TAP\_1}$ | $VN_{TAP\_1}$ | 342 |
| ⋮ | $VN_{TAP\_0}$ | $VN_{TAP\_0}$ | $VN_{TAP\_1}$ | $VN_{TAP\_1}$ | $VN_{TAP\_1}$ | |
| | $VN_{TAP\_0}$ | $VN_{TAP\_1}$ | $VN_{TAP\_1}$ | $VN_{TAP\_1}$ | $VN_{TAP\_1}$ | |
| | $VN_{TAP\_1}$ | $VN_{TAP\_1}$ | $VN_{TAP\_1}$ | $VN_{TAP\_1}$ | $VN_{TAP\_1}$ | |
| | $VN_{TAP\_2}$ | $VN_{TAP\_1}$ | $VN_{TAP\_1}$ | $VN_{TAP\_1}$ | $VN_{TAP\_1}$ | |
| | $VN_{TAP\_2}$ | $VN_{TAP\_2}$ | $VN_{TAP\_1}$ | $VN_{TAP\_1}$ | $VN_{TAP\_1}$ | |
| | $VN_{TAP\_2}$ | $VN_{TAP\_2}$ | $VN_{TAP\_2}$ | $VN_{TAP\_1}$ | $VN_{TAP\_1}$ | |
| | $VN_{TAP\_2}$ | $VN_{TAP\_2}$ | $VN_{TAP\_2}$ | $VN_{TAP\_2}$ | $VN_{TAP\_1}$ | |
| | $VN_{TAP\_2}$ | $VN_{TAP\_2}$ | $VN_{TAP\_2}$ | $VN_{TAP\_2}$ | $VN_{TAP\_2}$ | |
| | $VN_{TAP\_2}$ | $VN_{TAP\_2}$ | $VN_{TAP\_2}$ | $VN_{TAP\_2}$ | $VN_{TAP\_3}$ | |
| | $VN_{TAP\_2}$ | $VN_{TAP\_2}$ | $VN_{TAP\_2}$ | $VN_{TAP\_3}$ | $VN_{TAP\_3}$ | |
| | $VN_{TAP\_2}$ | $VN_{TAP\_2}$ | $VN_{TAP\_3}$ | $VN_{TAP\_3}$ | $VN_{TAP\_3}$ | |
| | $VN_{TAP\_2}$ | $VN_{TAP\_3}$ | $VN_{TAP\_3}$ | $VN_{TAP\_3}$ | $VN_{TAP\_3}$ | |
| | $VN_{TAP\_3}$ | $VN_{TAP\_3}$ | $VN_{TAP\_3}$ | $VN_{TAP\_3}$ | $VN_{TAP\_3}$ | |
| $SEL\_N1_M$ | $VN_{TAP\_X}$ | $VN_{TAP\_X}$ | $VN_{TAP\_X}$ | $VN_{TAP\_X}$ | $VN_{TAP\_X}$ | |

FIG. 3D

CLOCK ADJUSTMENT CIRCUIT WITH BIAS SCHEME

BACKGROUND

Many semiconductor devices typically have a clock path to generate clock signals and other circuitry to correct the timing of the clock signal to meet specifications. Some conventional clock paths have a circuit with a variable load capacitor at the circuit output to adjust the rising or falling edge of the clock signal by varying the value of the capacitor. However, the circuit in these conventional clock paths often has drawbacks. For example, the circuit consumes relatively high power because the delay in the timing of the clock signal is controlled by the capacitor. Capacitor changing by process and temperature can limit the delay range and delay step provided by the circuit. Thus, a relatively higher number of stages, which further increase power consumption, need to be used in the delay line to obtain a suitable delay range. Some other conventional clock paths have a circuit to correct (e.g., increased or decreased) the duty cycle of the clock signal at the circuit output in which the circuit has a variable current generator (e.g., current source, a current sink, or both) at the circuit output. The duty cycle may be corrected by drawing more current from the supply voltage or sinking more current to the ground. However, this circuit usually has a relatively high current consumption. The fine delay step in this circuit may also be difficult to realize because the time delay of the fine delay step depends on the minimum current step of the variable current generator. The description below provides techniques that have improvements and benefits over some conventional circuits, such as the conventional circuits mentioned above.

BRIEF DESCRIPTION OF THE DRAWINGS

FIG. 3A, FIG. 3B, and FIG. 3C are tables showing examples of different combinations of tap voltages provided as bias voltages to the gates of transistors (e.g., p-channel transistors) in a portion of each stage of the clock signal adjustment circuit of FIG. 1, according to some embodiments described herein.

FIG. 3D is table showing examples of different combinations of tap voltages provided as bias voltages to the gates of transistors (e.g., n-channel transistors) in another portion of a stage, the clock signal adjustment circuit of FIG. 1, according to some embodiments described herein.

DETAILED DESCRIPTION

The techniques described herein involve a clock signal adjustment circuit and an associated bias scheme to generate bias voltages for transistors in the clock signal adjustment circuit. The clock signal adjustment circuit can include multiple series-connected stages (e.g., delay stages or delay elements). Each stage can include an input to receive a clock signal and an output to provide a clock signal. Each stage has a structure (circuit elements) to allow the rising or falling edge of a clock signal at the stage output to be independently controlled (e.g., adjusted). Each stage can also provide sufficient delay range within which the edges (rising and falling edges) can be adjusted. The bias scheme of the described technique can include a voltage generator, which can include a tap voltage circuit to generate tap voltages that have different values, and a select circuit to select from among the tap voltages responsive to select information (delay codes) provided to the select circuit. The select circuit can provide the selected tap voltages as bias voltages for respective transistors of the clock signal adjustment circuit. The time delay applied to an edge (e.g., rising or falling edge) of a clock signal at the output of the clock signal adjustment circuit can be based on the selected tap voltages. The structure of the stage in the described techniques allows a number of the stages of the described clock signal adjustment circuit to be relatively small. Therefore, power consumption can be relatively low. The delay codes in each stage can also be set (e.g., calibrated) to improve (e.g., reduce) jitter performance. Other improvements and benefits of the described techniques are discussed below.

Figure 1:
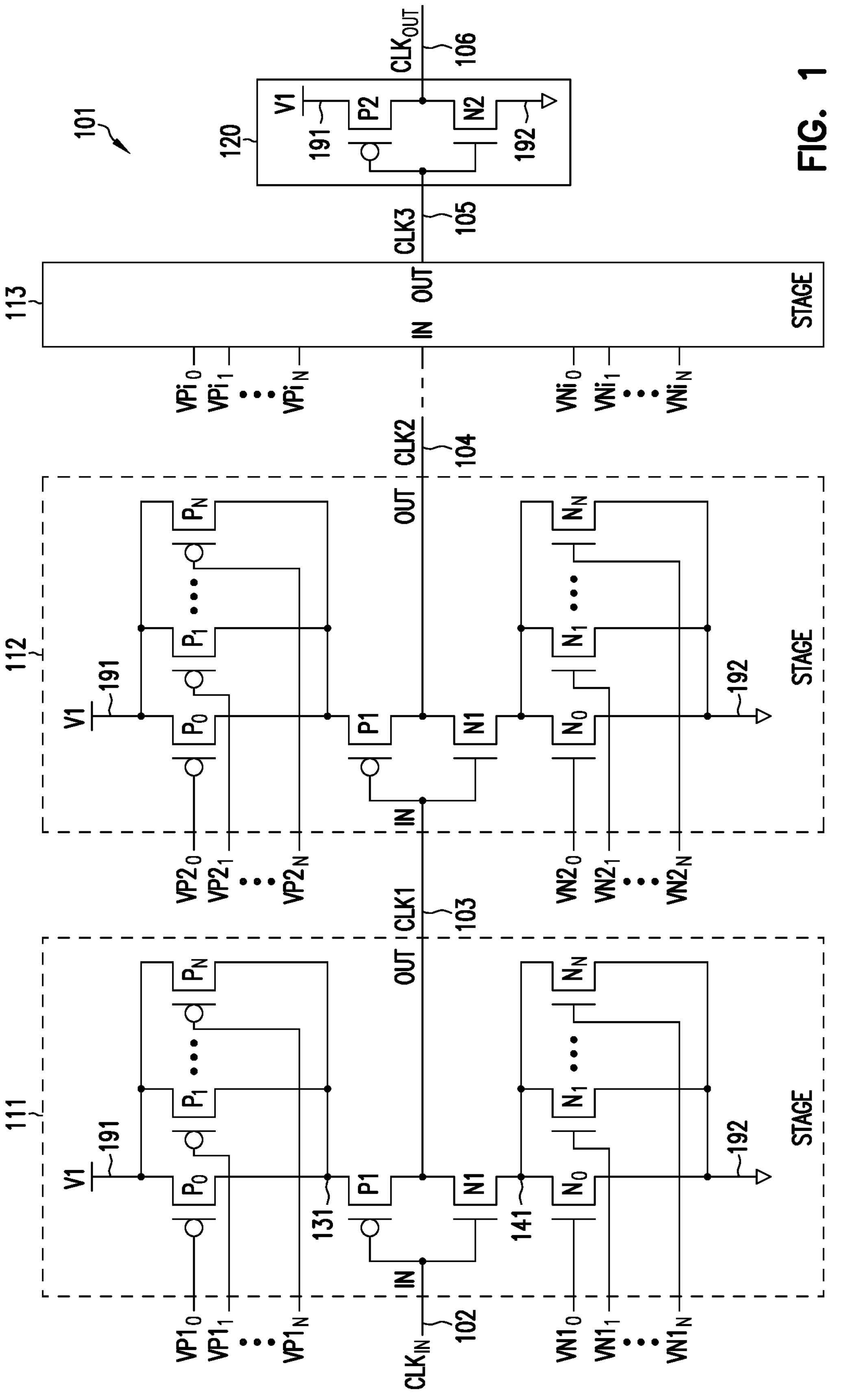
FIG. 1 shows an apparatus in the form of a clock signal adjustment circuit including stages (e.g., delay stages), according to some embodiments described herein.

FIG. 1 shows a clock signal adjustment circuit 101, according to some embodiments described herein. Clock signal adjustment circuit 101 can be used in a clock path of a device or system (e.g., in device 602 of FIG. 6). As shown in FIG. 1, clock signal adjustment circuit 101 can include stages 111, 112, and 113, and an inverter 120 coupled in series between a node (e.g., clock input node) 102 and a node (e.g., clock output node) 106. Clock signal adjustment circuit 101 can receive a clock signal (e.g., an input clock signal) $CLK_{IN}$ and provide a clock signal (e.g., an output clock signal) $CLK_{OUT}$, which can have the same frequency as clock signal $CLK_{IN}$.

FIG. 1 shows an example of a clock signal adjustment circuit 101 having three stages 111, 112, and 113. However, clock signal adjustment circuit 101 can include fewer than three stages or more than three stages. The number of stages can be based on the delay range, swing limitations, and jitter specifications associated with clock signal adjustment circuit 101. For example, clock signal adjustment circuit 101 can include a single stage (instead of three stages), such as stage 111, coupled between nodes 102 and 106. In another example, clock signal adjustment circuit 101 can include two stages (instead of three stages), such as stages 111 and 112, coupled between nodes 102 and 106. Stages 111, 112, and 113 can have the same circuit elements (e.g., transistors and associated connections). For simplicity, FIG. 1 shows details of only two stages 111 and 112. Each of stages 111, 112, 113 can be called a delay stage (or alternatively a delay unit cell) of clock signal adjustment circuit 101.

Each of stages 111, 112, and 113 can include an input (e.g., an input node labeled "IN") and an output (e.g., an output node labeled "OUT"). The input (IN) of a succeeding stage (e.g., stage 112) can be coupled to the output (OUT) of a preceding stage (e.g., stage 111) to receive a clock signal provided at the output of the preceding stage. As shown in FIG. 1, stage 111 can receive clock signal $CLK_{IN}$ at its input IN and provide a clock signal CLK1 at its output OUT. Stage 112 can receive clock signal CLK1 at its input IN and provide a clock signal CLK2 at its output OUT. Stage 113 can receive clock signal CLK2 at its input IN and provide a clock signal CLK3 at its output OUT. Inverter 120 can receive clock signal CLK3 at its input (coupled to a node 105) and provide clock signal $CLK_{OUT}$ at its output (coupled to node 106). Signals $CLK_{IN}$, CLK1, CLK2, CLK3, and $CLK_{OUT}$ can have the same (an equal) frequency (e.g., frequency measured in Gigahertz). Signals $CLK_{IN}$, CLK1, CLK2, CLK3, and $CLK_{OUT}$ can have the same duty cycle (e.g., 50% duty cycle).

As shown in FIG. 1, stage 111 can include transistors P1 and N1, transistors $P_0$ through $P_N$, and transistors $N_0$ through $N_N$. Transistors P1 and N1 can have different transistor types. For example, transistors P1 and N1 can include p-type (e.g., p-channel) and n-type (e.g., n-channel) transistors, respectively. An example of a p-type transistor includes a p-channel metal oxide semiconductor (MOS) field effect transistor (FET), also called PMOS. An example of an n-type transistor includes n-channel MOSFET, also called NMOS. As shown in FIG. 1, transistors $P_0$ through $P_N$ can have the same type (e.g., p-type). Transistors $N_0$ through $N_N$ can have the same type (e.g., n-type) that differs from the type of transistors $P_0$ through $P_N$. NMOS and PMOS transistors are used herein as examples. However, other types of transistors can be used.

As shown in FIG. 1, transistors P1 and N1 can have a common gate (e.g., a shared gate coupled to node 102) coupled to the input IN (at node 102) of stage 111 to receive clock signal $CLK_{IN}$. Transistors P1 and N1 can have a common terminal (e.g., a common drain or shared drain coupled node 103) coupled to the output OUT (at node 103) of stage 111 to provide a clock signal CLK1 based on clock signal $CLK_{IN}$, such that the frequency of clock signal CLK1 can be equal to the frequency of clock signal $CLK_{IN}$.

Figure 2A:
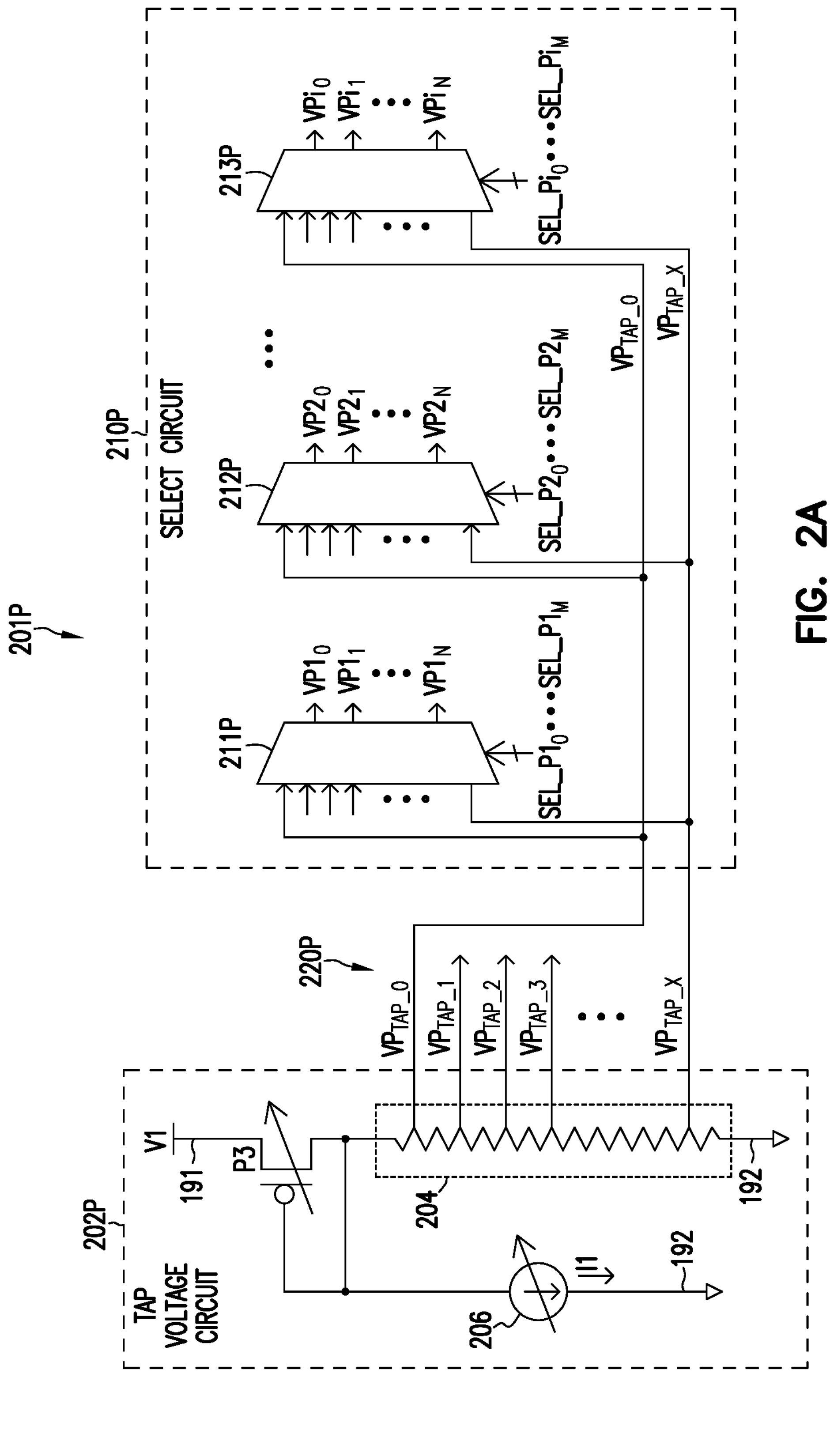
FIG. 2A shows a block diagram of a bias scheme including a voltage generator to generate bias voltages for respective transistors (e.g., p-channel transistors) in a portion of each stage of the clock signal adjustment circuit of FIG. 1, according to some embodiments described herein.

Transistors $P_0$ through $P_N$ can be coupled in parallel with each other between a terminal (e.g., the source at a node 131) of transistor P1 and a supply node 191. Voltage V1 at supply node 191 can be a supply voltage (e.g., Vcc) for clock signal adjustment circuit 101. Transistors $P_0$ through $P_N$ can have gates (separate gates) to receive respective voltages (e.g., bias voltages) $VP1_0$ through $VP1_N$. Voltages $VP1_0$ through $VP1_N$ can be generated by a voltage (e.g., bias voltage) generator 201P (FIG. 2A, described below). The number of transistors $P_0$ through $P_N$ is N+1, where N is an integer equal to at least one. For example, stage 111 can include five (N=4) transistors (e.g., $P_0$ through $P_4$) coupled in parallel with each other between node 131 and supply node 191. Five transistors $P_0$ through $P_N$ are used as examples to easily follow the description herein. However, the number of transistors $P_0$ through $P_N$ can differ from five. In the example where stage 111 includes five transistors (e.g., $P_0$ through $P_4$) between node 131 and supply node 191, there can be five voltages (e.g., voltages $VP1_0$ through $VP1_4$) provided to respective gates of the five transistors.

Figure 2B:
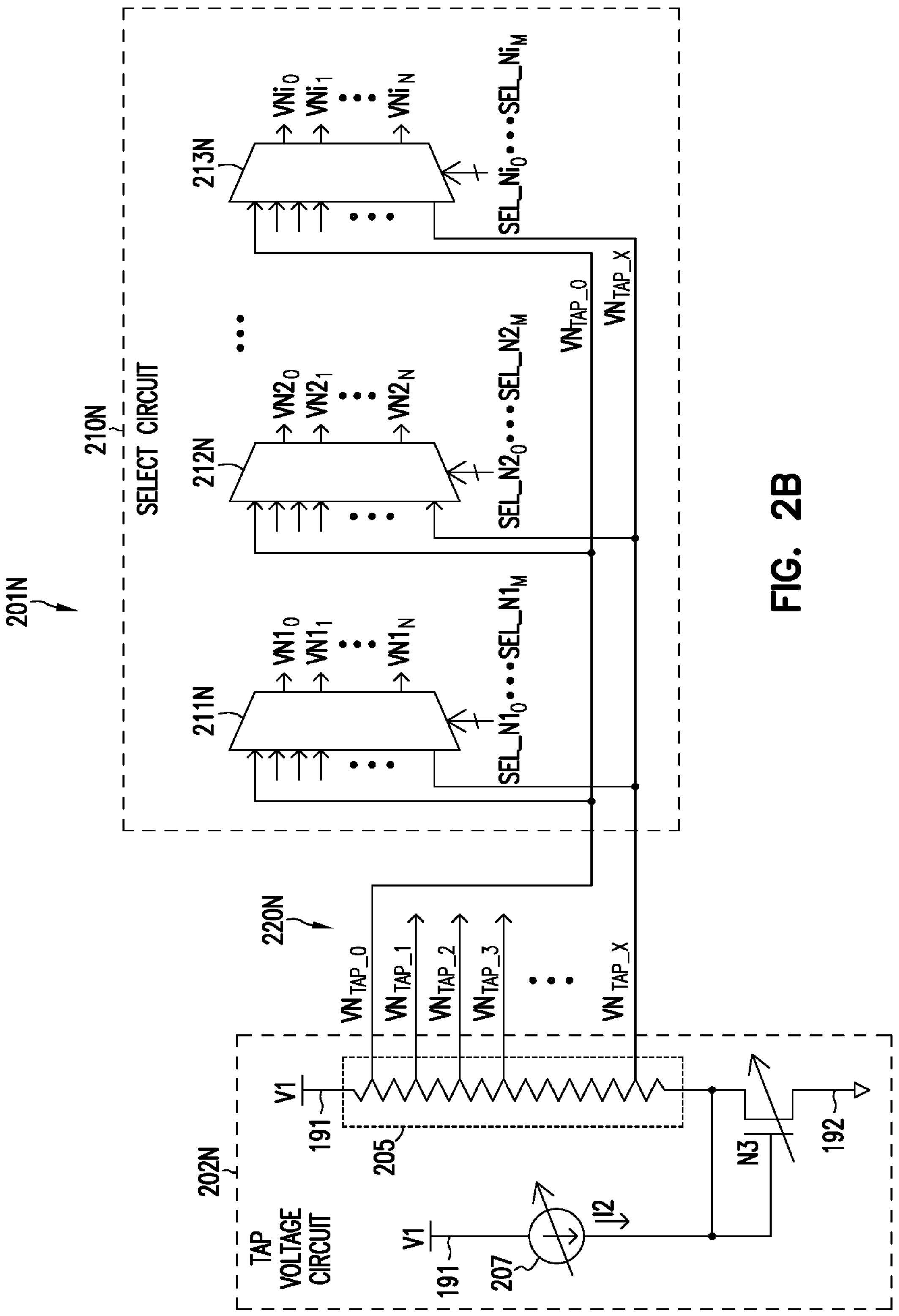
FIG. 2B shows a block diagram of a bias scheme including a voltage generator to generate bias voltages for respective transistors (e.g., n-channel transistors) in another portion of each stage of the clock signal adjustment circuit of FIG. 1, according to some embodiments described herein.

As shown in FIG. 1, transistors $N_0$ through $N_N$ can be coupled in parallel with each other between a terminal (e.g., the source at a node 141) of transistor N1 and a supply node 192. Supply node 192 can receive a voltage less than voltage V1. For example, the voltage at supply node 192 can be a ground potential (e.g., voltage Vss). As shown in FIG. 1, transistors $N_0$ through $N_N$ can have gates (separate gates) to receive respective voltages (e.g., bias voltages) $VN1_0$ through $VN1_N$, which are different from voltages $VP1_0$ through $VP1_N$. Voltages $VN1_0$ through $VN1_N$ can be generated by a voltage (e.g., bias voltage) generator 201N (FIG. 2B, described below). The number of transistors $N_0$ through $N_N$ is N+1, where N is an integer equal to at least one. The number of transistors $N_0$ through $N_N$ can be equal to the number of transistors $P_0$ through $P_N$.

Stage 112 can have similar or the same circuit elements as stage 111. For simplicity, stage 112 is not described in detail. As shown in FIG. 1, similar to stage 111, stage 112 can include transistors P1 and N1, transistors $P_0$ through $P_N$, and transistors $N_0$ through $N_N$. Transistors P1 and N1 of stage 112 can have a common gate (e.g., a shared gate coupled to node 103) coupled to the input IN (at node 103) of stage 112 to receive clock signal CLK1, and a common terminal (e.g., a common drain or shared drain coupled node 104) coupled to the output OUT (at node 104) of stage 112 to provide a clock signal CLK2 based on clock signal CLK1.

The gates of transistors $P_0$ through $P_N$ of stage 112 can receive voltages (e.g., bias voltages) $VP2_0$ through $VP2_N$, which can be different from (or the same as) voltages $VP1_0$ through $VP1_N$ provided to the gates of transistors $P_0$ through $P_N$ of stage 111. Voltages $VP2_0$ through $VP2_N$ can be generated by voltage generator 201P (FIG. 2B, described below). The gates of transistors $N_0$ through $N_N$ of stage 112 can receive voltages (e.g., bias voltages) $VN2_0$ through $VN2_N$, which can be different from (or the same as) voltages $VN1_0$ through $VN1_N$ provided to the gates of transistors $N_0$ through $N_N$ of stage 111. Voltages $VN2_0$ through VN2xxxN can be generated by voltage generator 201N (FIG. 2B, described below).

Similarly, stage 113 can receive voltages (e.g., bias voltages) $VP1_0$ through $VPi_N$ at the gates of transistors (not shown) similar to transistors $P_0$ through $P_N$ of stage 111 or stage 112, and voltages (e.g., bias voltages) $VNi_0$ through $VNi_N$ at the gates of transistors (not shown) similar to transistors $N_0$ through $N_N$ of stage 111 (or stage 112). Voltages $VPi_0$ through $VPi_N$ can be generated by voltage generator 201P (FIG. 2B, described below). Voltages $VNi_0$ through $VNi_N$ can be generated by voltage generator 201N (FIG. 2B, described below).

As shown in FIG. 1, stage 111 is a current starved architecture. Transistors P1 and N1 can have a relatively small length (e.g., minimum length relative to other transistors in stage 111). Such a relatively small length allows transistors P1 and N1 to support the relatively high speed (e.g., high frequency in the gigahertz range) clock signal. The length (e.g., channel length L) and width (e.g., channel width W) of transistors $P_0$ through $P_N$ and $N_0$ through $N_N$ can be greater than that of transistors P1 and N1. For example, to control (e.g., limit) the contribution of noise (e.g., 1/f noise), the length and width of each of transistors $P_0$ through $P_N$ and $N_0$ through $N_N$ can be increased (e.g., can be greater that of transistors P1 and N1).

Transistors $P_0$ through $P_N$ of stage 111 can be controlled independently by respective voltages $VP1_0$ through $VP1_N$ to generate the expected delay range (time delay range) and delay step (e.g., coarse or fine delay step) for an edge (e.g., the rising edge) of clock signal CLK1. The delay range associated with a rising edge of the clock signal (e.g., clock signals CLK1, CLK2, or CLKi) at an output (OUT) of a stage (e.g., stage 111, 112, or 113) of clock signal adjustment circuit 101 is a range of time delay within which the timing (occurrence) of the rising edge can be adjusted. Similarly, transistors $N_0$ through $N_N$ of stage 111 can be controlled independently by respective voltages $VN1_0$ through $VN1_N$ to generate the expected delay range (time delay range) and delay step for another edge (e.g., the falling edge) of clock signal CLK1. The delay range associated with a falling edge of the clock signal (e.g., clock signals CLK1, CLK2, or CLKi) at an output (OUT) of a stage (e.g., stage 111, 112, or 113) of clock signal adjustment circuit 101 is a range of time delay within which the timing (occurrence) of the falling edge can be adjusted. The delay range and delay step in stages 112 and 113 can be based on voltages provided to the gates of respective transistors $P_0$ through $P_N$ and $N_0$ through $N_N$ in respective stages 112 and 113.

FIG. 1 shows a single transistor (e.g., $P_0$, $P_1$, or $P_N$) coupled on a respective circuit path (e.g., current path) between node 131 and supply node 191. However, in an example, transistors $P_0$ through $P_N$ can have a stacked structure, such that instead of a single transistor, two or more transistors (e.g., two or more transistors like transistor $P_0$) can be coupled in series (stacked one over another) on a respective circuit path between node 131 and supply node 191. Such a stacked structure can increase (e.g., double) the length of transistors $P_0$ through $P_N$ to further reduce noise (e.g., 1/f noise). Similarly, transistors $N_0$ through $N_N$ can have a stacked structure to reduce noise further. For example, instead of a single transistor, two or more transistors (e.g., two or more transistors like transistor $N_0$) can be coupled in series (stacked one over another) on a respective circuit path between node 141 and supply node 192.

The timing of the rising edge of clock signal CLK1 (at the output OUT) of stage 111 can be controlled (e.g., adjusted) independently (e.g., separately) from the timing of the falling edge of clock signal CLK1. For example, the rising edge of clock signal CLK1 can be adjusted (varied) by adjusting (e.g., selecting) voltages $VP1_0$ through $VP1_N$, so that the rising edge of clock signal CLK1 can occur earlier or later (e.g., like rising edge 401 or 402 in FIG. 4B, described below) relative to a reference timing point (e.g., time T1 in FIG. 4B). In another example, the falling edge of clock signal CLK1 can be adjusted (varied) by adjusting (e.g., selecting) voltages $VN1_0$ through $VN1_N$, so that the falling edge of clock signal CLK1 can occur earlier or later relative another reference timing point. Selecting voltages $VP1_0$ through $VP1_N$ and $VN1_0$ through $VN1_N$ can be performed by a select circuit 210P (FIG. 2A) and select circuit 210N (FIG. 2B), respectively, as described in detail below.

Similarly, the timing of the rising edge of clock signal CLK2 (at the output OUT) of stage 112 in FIG. 1 can be controlled (e.g., adjusted) independently (e.g., separately) from the timing of the falling edge of clock signal CLK2. For example, the rising edge of clock signal CLK2 can be adjusted (varied) by adjusting (e.g., selecting) voltages $VP2_0$ through $VP2_N$, so that the rising edge of clock signal CLK2 can occur earlier or later relative to a reference timing point. In another example, the falling edge of clock signal CLK2 can be adjusted (varied) by adjusting (e.g., selecting) voltages $VN2_0$ through $VN2_N$, so that the falling edge of clock signal CLK2 can occur earlier or later relative to a reference timing point. Selecting voltages $VP2_0$ through $VP2_N$ and $VN2_0$ through $VN2_N$ can be performed by a select circuit 210P (FIG. 2A) and select circuit 210N (FIG. 2N), respectively, as described in detail below.

By controlling (e.g., adjusting) the timing (e.g., the timing of the rising edge, the falling edge, or both) in at least one of the stages (e.g., one or more of stages 111, 112, and 113) of clock signal adjustment circuit 101, the timing (e.g., expected timing) of clock signal $CLK_{OUT}$ can be controlled. Controlling the timing of the edges of a clock signal described herein (e.g., clock signals CLK1, CLK2, CLK3, and $CLK_{OUT}$) using clock signal adjustment circuit 101 can also improve (e.g., reduce) power consumption clock signal adjustment circuit 101 in comparison with some conventional techniques.

Inverter 120 (FIG. 1) can be included in clock signal adjustment circuit 101 to allow clock signal $CLK_{OUT}$ to have a full swing (e.g., rail-to-rail voltage swing). In an example, where the clock signal (e.g., clock signal CLK1, CLK2, or CLK3) of an output stage (e.g., last stage) of clock signal adjustment circuit 101 has a full swing, inverter 120 can be omitted from clock signal adjustment circuit 101.

FIG. 2A shows a block diagram of a bias scheme including voltage generator 201P to generate voltages $VP1_0$ through $VP1_N$, $VP2_0$ through $VP2_N$, and $VPi_0$ through $VPi_N$ for transistors $P_0$ through $P_N$ of stages 111, 112, and 113, respectively, of FIG. 1, according to some embodiments described herein. As shown in FIG. 2A, voltage generator 201P can include a tap voltage circuit 202P to generate voltages (tap voltages) $VP_{TAP\_0}$ through $VP_{TAP\_X}$ at nodes (e.g., output nodes) 220P, and a select circuit 210P to select a combination of voltages from among voltages $VP_{TAP\_0}$ through $VP_{TAP\_x}$ at nodes 220P and provide the selected voltages (e.g., a selected combination of voltages) as voltages $VP1_0$ through $VP1_N$, $VP2_0$ through $VP2_N$, and $VPi_0$ through $VPi_N$.

As shown in FIG. 2A, tap voltage circuit 202P can include a transistor P3 (e.g., a p-type transistor), a resistor ladder 204, and a current generator (e.g., current sink) 206. Resistor ladder 204 can be coupled between transistor P3 and supply node 192. Transistor P3 can be connected as a diode between supply node 191 and resistor ladder 204. Voltage $VP_{TAP\_0}$ through $VP_{TAP\_x}$ can be generated using resistor ladder 204, which is biased by transistor P3. Resistor ladder 204 can include different nodes (e.g., different taps coupled to respective nodes 220P) to provide voltages $VP_{TAP\_0}$ through $VP_{TAP\_x}$ having different values. This structure of tap voltage circuit 202P allows voltage $VP_{TAP\_0}$ through $VP_{TAP\_X}$ to start close to the threshold voltage of transistors $P_0$ through $P_N$ (FIG. 1). The tap voltage range for transistors $P_0$ through $P_N$ can be selected from approximately (V1-|VGS(P3)|) to V_192, where voltage VGS(P3) is the voltage between the gate and source of transistor P3, and voltage V_192 is the voltage (e.g., ground) at supply node 192. This range voltage range (V1-|VGS(P3)|) to V_192) defines the delay range that can be achieved by selecting different voltages $VP_{TAP\_0}$ through $VP_{TAP\_X}$.

Voltages (e.g., $VP_{TAP\_0}$ and $VP_{TAP\_1}$) towards the supply voltage (e.g., V1) can provide a higher delay (e.g., more time delay) for the edge (e.g., rising edge) of the clock controlled by transistors $P_0$ through $P_N$ (FIG. 1). Tap voltages (e.g., lower voltage taps) towards supply node 192 (e.g., ground) can provide a lower delay (e.g., lower time delay) for the edge (e.g., rising edge) of the clock controlled by transistors $P_0$ through $P_N$. In FIG. 2A, by adjusting the size of transistor P3 (diode connected transistor P3), the voltage $VP_{TAP\_0}$=V1-|VGS(P3)| is affected. This, in turn, can adjust the delay range of each stage (e.g., stage 111, 112, or 113) of clock signal adjustment circuit 101. In FIG. 2A, current I1 can be adjusted by adjusting current generator 206 to fine tune the voltage VGS (e.g., diode drop voltage) of transistor P3, namely to fine tune the voltage $VP_{TAP\_0}$.

As shown in FIG. 2A, select circuit 210P can include multiplexers 211P, 212P, and 213P. Multiplexers 211P, 212P, and 213P can have respective inputs coupled to the same outputs (at nodes 220P) of resistor ladder 204. Thus, multiplexers 211P, 212P, and 213P can receive the same input voltages, which are voltages $VP_{TAP\_0}$ through $VP_{TAP\_X}$.

Multiplexers 211P, 212P, and 213P can include respective outputs coupled to the gates of respective transistors $P_0$ through $P_N$ of stages 111, 112, and 113 of FIG. 1 to provide voltages $VP1_0$ through $VP1_N$, $VP2_0$ through $VP2_N$, and $VPi_0$ through $VPi_N$, respectively, to the gates of transistors $P_0$ through $P_N$ of stages 111, 112, and 113, respectively. Multiplexers 211P, 212P, and 213P can be independently controlled using select information (e.g., digital information or delay codes) $SEL\_P1_0$ through $SEL\_P1_M$, $SEL\_P2_0$ through $SEL\_P2_M$, and $SEL\_Pi_0$ through $SEL\_Pi_M$, respectively, at control nodes (e.g., control inputs) of respective multiplexers 211P, 212P, and 213P. The structure of tap voltage circuit 202P and select circuit 210P can form a digital-to-analog converter (DAC) to convert digital information (e.g., $SEL\_P1_0$ through $SEL\_P1_M$, $SEL\_P2_0$ through $SEL\_P2_M$, and $SEL\_Pi_0$ through $SEL\_Pi_M$) to corresponding analog voltages (among voltages $VP_{TAP\_0}$ through $VP_{TAP\_X}$).

Figure 3B:
Figure 3A:
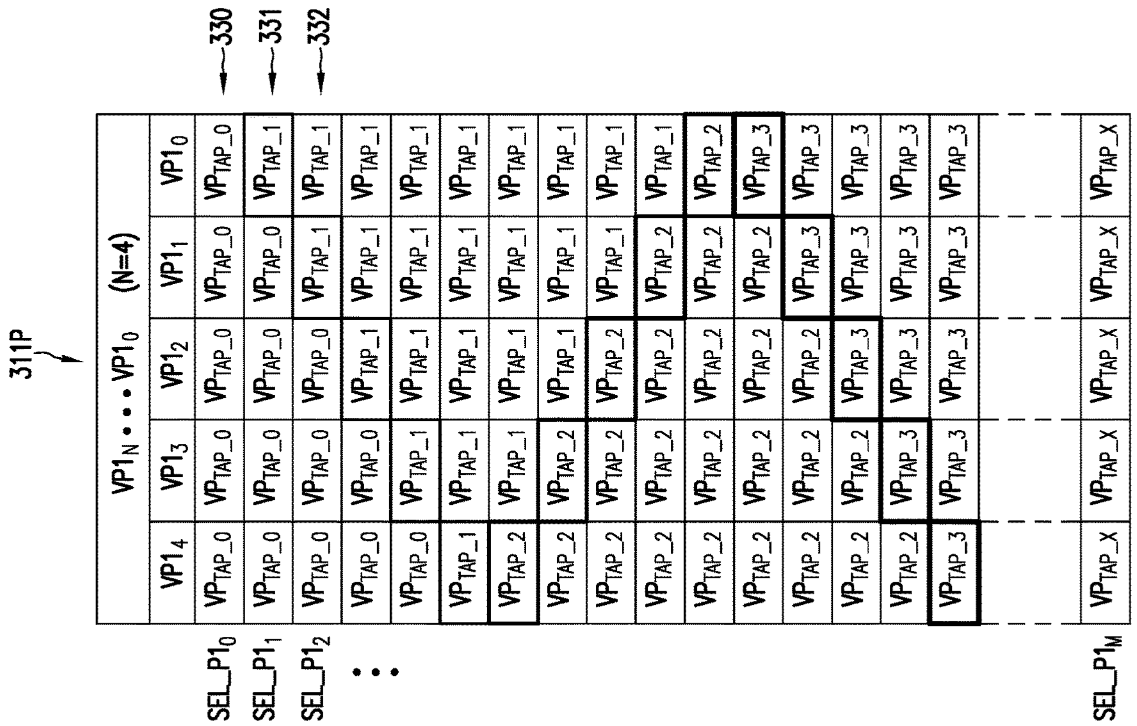

Each of select information (e.g., each of delay codes) $SEL\_P1_0$ through $SEL\_P1_M$ can have a number of bits (e.g., k bits, where k is an integer). The number of bits can be the same among select information $SEL\_P1_0$ through $SEL\_P1_M$. For example, $SEL\_P1_0$ can have k bits, $SEL\_P1_1$ can have k bits, $SEL\_P1_M$ can have k bits. Thus, the number (e.g., total number) of select information (e.g., the number of delay codes) $SEL\_P1_0$ through $SEL\_P1_M$ can be $M+1=2^k$ (e.g., M+1 delay codes). In this example, a different value (digital value) of the combination of the k bits can allow different combinations of voltages (tap voltages) $VP_{TAP\_0}$ through $VP_{TAP\_X}$ at nodes 220P to be selected by multiplexer 211P and provided to the gates of transistors $P_0$ through $P_N$ of stage 111 (FIG. 1). FIG. 3A (described in detail below) shows examples of different combinations of voltages $VP_{TAP\_0}$ through $VP_{TAP\_X}$ provided to the gates of transistors $P_0$ through $P_N$ (where N=4, for example) of stage 111.

Select information $SEL\_P2_0$ through $SEL\_P2_M$ and select information $SEL\_Pi_0$ through $SEL\_Pi_M$ can have a number of bits (e.g., k bits) like select information $SEL\_P1_0$ through $SEL\_P1_M$. Thus, the number (e.g., total number) of select information (e.g., the number of delay codes) $SEL\_P2_0$ through $SEL\_P2_M$ can also be $M+1=2^k$. The number (e.g., total number) of select information (e.g., the number of delay codes) $SEL\_Pi_0$ through $SEL\_Pi_M$ can also be $M+1=2^k$.

A different value (digital value) of the combination of the bits (e.g., k bits) of select information $SEL\_P2_0$ through $SEL\_P2_M$ can allow a different combination of voltages (tap voltages) $VP_{TAP\_0}$ through $VP_{TAP\_X}$ at nodes 220P to be selected by multiplexer 212P and provided to the gates of transistors $P_0$ through $P_N$ of stage 112 (FIG. 1). A different value (digital value) of the combination of the bits (e.g., k bits) of select information $SEL\_Pi_0$ through $SEL\_Pi_M$ can allow a different combination of voltages (tap voltages) $VP_{TAP\_0}$ through $VP_{TAP\_X}$ at nodes 220P to be selected by multiplexer 213P and provided to the gates of transistors $P_0$ through $P_N$ (not shown) of stage 113. FIG. 3B and FIG. 3C (described in detail below) show examples of different combinations of voltages $VP_{TAP\_0}$ through $VP_{TAP\_X}$ provided to the gates of transistors $P_0$ through $P_N$ (where N=4, for example) of stage 112 and 113, respectively.

Voltages $VP1_0$ through $VP1_N$, $VP2_0$ through $VP2_N$, and $VPi_0$ through $VPi_N$ can be the same among each other or different from each other depending on the values of $SEL\_P1_M$, $SEL\_P2_0$ through $SEL\_P2_M$, and $SEL\_Pi_0$ through $SEL\_Pi_M$ provided to respective multiplexers 211P, 212P, and 213P. The number of the multiplexers (e.g., multiplexers 211P, 212P, and 213P) of select circuit 210P can be based on (e.g., the same as) the number of the stages (e.g., stages 111, 112, and 113) of clock signal adjustment circuit 101, so that transistors $P_0$ through $P_N$ of the stages can be independently controlled.

To obtain the maximum delay range for each of stages 111, 112, and 113, a linear delay variation and consistent delay step may be employed. Voltages $VP1_0$ through $VP1_N$ can be changed (varied) in a non-linear manner with respect to the values of select information (e.g., digital code) $SEL\_P1_M$, so that a nearly linear delay profile and consistent delay step can be obtained in stage 111. Similarly, voltages $VP2_0$ through $VP2_N$ and $VPi_0$ through $VP_{iN}$ can be varied in a non-linear manner with respect to the values of select information (e.g., digital code) $SEL\_P1_M$, $SEL\_P2_0$, and $SEL\_P1_M$, $SEL\_Pi_0$, respectively, so that nearly linear delay profile and consistent delay step can be obtained in respective stages 112 and 113.

FIG. 2B shows a block diagram of a bias scheme including voltage generator 201N to generate voltages $VN1_0$ through $VN1_N$, $VN2_0$ through $VN2_N$, and $VNi_0$ through $VNi_N$ for respective transistors $N_0$ through $N_N$ of stages 111, 112, and 113, respectively, of FIG. 1, according to some embodiments described herein. Voltage generator 201P (FIG. 2A) and voltage generator 201N (FIG. 2B) are part of an independent bias scheme to provide bias voltages to the gates of transistors $P_0$ through $P_N$ of stages 111, 112, and 113 (FIG. 1) independent from (different from) bias voltages provided to the gates of transistors $N_0$ through $N_N$ of stages 111, 112, and 113 (FIG. 1).

As shown in FIG. 2B, including voltage generator 201N can include a tap voltage circuit 202N to generate voltages (tap voltages) $VN_{TAP\_0}$ through $VN_{TAP\_X}$ at nodes (e.g., output nodes) 220N. Multiplexers 211N, 212N, and 213N of a select circuit 210N can select voltages $VN_{TAP\_0}$ through $2VN_{TAP\_X}$ and provide voltages $VN1_0$ through $VN1_N$, $VN2_0$ through $VN_N$, and $VNi_0$ through $VNi_N$, respectively, based on the selected combination of voltages $VN_{TAP\_0}$ through $VN_{TAP\_X}$. The number of the multiplexers (e.g., multiplexers 211N, 212N, and 213N) of select circuit 210N can be based on (e.g., the same as) the number of the stages (e.g., stages 111, 112, and 113) of clock signal adjustment circuit 101, so that transistors $N_0$ through $N_N$ of the stages can be independently controlled.

The structure and operation of voltage generator 201N are similar to that of voltage generator 201P of FIG. 2A. For example, multiplexers 211N, 212N, and 213N can be independently controlled using select information (e.g., digital information or delay codes) $SEL\_N1_0$ through $SEL\_N1_M$, $SEL\_N2_0$ through $SEL\_N2_M$, and $SEL\_Ni_0$ through $SEL\_Ni_M$, respectively, at control nodes (e.g., control inputs) of respective multiplexers 211N, 212N, and 213N. The structure of tap voltage circuit 202N and select circuit 210N can form a DAC convert digital information (e.g., $SEL\_N1_0$ through $SEL\_N1_M$, $SEL\_N2_0$ through $SEL\_N2_M$, and $SEL\_Ni_0$ through $SEL\_Ni_M$) to corresponding analog voltages (among voltages $VN_{TAP\_0}$ through $VN_{TAP\_X}$). For simplicity, similar circuit elements and operations are not described in detail for voltage generator 201N.

As shown in FIG. 2B, tap voltage circuit 202N can include a transistor N3 (e.g., an n-type transistor), a resistor ladder 205, and a current generator (e.g., current source) 207. Resistor ladder 205 can include different nodes (e.g., different taps coupled to respective nodes 220N) to provide voltages $VN_{TAP\_0}$ through $VN_{TAP\_X}$ having different values. Transistor N3 can be connected as a diode between supply node 191 and resistor ladder 205. The tap voltage range for transistors $N_0$ through $N_N$ can be selected from approximately VGS(N3) to V1, where voltage VGS(N3) is the voltage between the gate and source of transistor N3. This range voltage range (VGS(N3) to V1) defines the delay range (e.g., for the falling edge of signals CLK1, CLK2, or CLKi) that can be achieved by selecting different voltages $VN_{TAP\_0}$ through $VN_{TAP\_X}$. The delay range associated with a falling edge of the clock signal (e.g., clock signals CLK1, CLK2, or CLKi) at an output (OUT) of a stage (e.g., stage 111, 112, or 113) of clock signal adjustment circuit 101 can be the range of time delay within which the timing (occurrence) of the falling edge can be adjusted.

Voltages (e.g., $VN_{TAP\_0}$ and $VN_{TAP\_1}$) towards the supply voltage (e.g., V1) can provide a lower delay (e.g., less time delay) for the edge (e.g., falling edge) of the clock controlled by transistors $N_0$ through $N_N$ (FIG. 1). Tap voltages (e.g., lower voltage taps) towards VGS(N3) can provide a higher delay (e.g., more time delay) for the edge (e.g., falling edge) of the clock controlled by transistors $N_0$ through $N_N$. In FIG. 2B, by adjusting the size of transistor N3 (diode connected transistor N3), the effective tap voltage range can be adjusted from approximately (VGS(N3) to V1. This, in turn, can adjust the delay range of each stage (e.g., stage 111, 112, or 113) of clock signal adjustment circuit 101. In FIG. 2B, current 12 can be adjusted by adjusting current generator 207 to fine tune voltage VGS (e.g., diode drop voltage) of transistor N3.

Voltages $VN1_0$ through $VN1_N$, $VN2_0$ through $VN2_N$, and $VNi_0$ through $VN1_N$ can be varied in a non-linear manner with respect to the values of select information (e.g., digital code) $SEL\_P1_M$, $SEL\_P2_0$, and $SEL\_Pi00_M$, respectively, so that nearly linear delay profile and consistent delay step can be obtained in stages 111, 112, and 113, respectively.

The delay range and delay step in the stages (e.g., stages 111, 112, and 113) of clock signal adjustment circuit 101 (FIG. 1) can be adjusted (e.g., tuned) by varying the size of transistor P3 (FIG. 2A) and the value of current 11 (FIG. 2A) associated with current generator (e.g., current sink) 206 (FIG. 2A). Similarly, the delay range and delay step in the stages (e.g., stages 111, 112, and 113) of clock signal adjustment circuit 101 (FIG. 1) can be adjusted (e.g., tuned) by varying the size of transistor N3 (FIG. 2B) and the value of current 12 (FIG. 2B) associated with current generator (e.g., current source) 207 (FIG. 2B).

For example, if the size of transistor P3 (FIG. 2A) and/or transistor N3 (FIG. 2B) increases and the values of current I1 (FIG. 2A) and current 12 (FIG. 2B) remain unchanged (e.g., constant), tap voltage range generated by voltage generator 201P (FIG. 2A) and/or voltage generator 201N (FIG. 2B) will increase hence increasing delay range and delay step size. In another example, if the values of current I1 (FIG. 2A) and/or current I2 (FIG. 2B) increases and the sizes of transistor P3 (FIG. 2A) and transistor N2 (FIG. 2B) remain unchanged, tap voltage range generated by voltage generator 201P (FIG. 2A) and/or voltage generator 201N (FIG. 2B) will increase hence increasing delay range and delay step size. Tap voltage range generated by voltage generator 201P (at output nodes 220P at resistor ladder 204 in FIG. 2A) is the range from voltage $VP_{TAP\_0}$ to voltage $VP_{TAP\_X}$ (FIG. 2A). Tap voltage range generated by voltage generator 201N (at output nodes 220N at resistor ladder 205 in FIG. 2B) is the range from voltage $VN_{TAP\_0}$ to voltage $VN_{TAP\_X}$ (FIG. 2B).

FIG. 3A is a table 311P showing examples of different combinations of voltages $VP_{TAP\_0}$ through $VP_{TAP\_X}$ provided to the gates of transistors $P_0$ through $P_N$ of stage 111 of FIG. 1 as voltages $VP1_0$, $VP1_1$, $VP1_2$, $VP1_3$, and $VP1_4$ (where N=4 for example). Voltages $VP_{TAP\_0}$, $VP_{TAP\_1}$, $VP_{TAP\_2}$, $VP_{TAP\_3}$, and $VP_{TAP\_X}$ are the voltages (tap voltages) at nodes 220P (FIG. 2A) selected by multiplexer 211P based on the value of select information $SEL\_P1_0$, $SEL\_P1_1$, and $SEL\_P1_2$ through $SEL\_P1_M$. For simplicity, FIG. 3A shows only some of the select information and associated tap voltages.

As shown in FIG. 3A, each select information (e.g., $SEL\_P1_0$ through $SEL\_P1_M$) can be associated with a different combination of voltages $VP_{TAP\_0}$ through $VP_{TAP\_X}$ (FIG. 3A) to be provided the gates of transistors $P_0$ through $P_N$ voltages $VP1_0$, $VP1_1$, $VP1_2$, $VP1_3$, and $VP1_4$. Voltages $VP1_0$, $VP1_1$, $VP1_2$, $VP1_3$, and $VP1_4$ can change from one combination (e.g., one set) of values (among $VP_{TAP\_0}$ through $VP_{TAP\_X}$) to another one combination (e.g., another set) of values (among $VP_{TAP\_0}$ through $VP_{TAP\_X}$) responsive to the change in the select information. For example, voltages $VP1_0$, $VP1_1$, $VP1_2$, $VP1_3$, and $VP1_4$ can change from (row 330) $VP_{TAP\_0}$, $VP_{TAP\_0}$, $VP_{TAP\_0}$, $VP_{TAP\_0}$, and $VP_{TAP\_0}$ to (row 331) $VP_{TAP\_0}$, $VP_{TAP\_0}$, $VP_{TAP\_0}$, $VP_{TAP\_0}$, and $VP_{TAP\_1}$ responsive to select information changing from $SEL\_P1_0$ (row 330) to $SEL\_P1_1$ (row 331).

In another example, voltages $VP1_0$, $VP1_1$, $VP1_2$, $VP1_3$, and $VP1_4$ can change from (row 331) $VP_{TAP\_0}$, $VP_{TAP\_0}$, $VP_{TAP\_0}$, $VP_{TAP\_0}$, and $VP_{TAP\_1}$ to (row 332) $VP_{TAP\_0}$, $VP_{TAP\_0}$, $VP_{TAP\_0}$, $VP_{TAP\_1}$, and $VP_{TAP\_1}$ responsive to select information changing from $SEL\_P1_1$ (row 331) to $SEL\_P1_2$ (row 332).

Voltage $VP_{TAP\_0}$ is greater than each of the voltages $VP_{TAP\_1}$ through $VP_{TAP\_X}$. For example, voltage $VP_{TAP\_0}$ can be close to V1-|VGS(P3)|. Voltage $VP_{TAP\_1}$ can be voltage $VP_{TAP\_0}$-VPdeltaP (where VPdelta is a relatively small amount of voltage). Voltage $VP_{TAP\_2}$ can be voltage $VP_{TAP\_1}$-VPdelta, and so on. In this example, a particular transistor (e.g., one of transistors $P_0$ through $P_N$) provided with voltage $VP_{TAP\_1}$ can generate more current (higher current) than that particular transistor when it is provided with voltage $VP_{TAP\_0}$. Similarly, a particular transistor provided with voltage $VP_{TAP\_2}$ can generate more current than that particular transistor when it is provided with voltage $VP_{TAP\_1}$. A higher current of the transistor provides a lower delay. A lower delay (associated with the high current of transistors $P_0$ through $P_N$) can cause an edge (e.g., the rising edge) of the clock signal (e.g., clock signal CLK1) to occur earlier relative to (e.g., to the left) a reference timing point (e.g., time T1 in FIG. 4B, described below).

In table 311P in FIG. 3A, the value of select information $SEL\_P1_0$ through $SEL\_P1_M$ can be set to change from a lower value (e.g., lower digital code value) to a higher value (e.g., higher digital code value). Thus, as shown in table 311P, the delay can decrease in the direction from row 330 to 332 (from top to bottom of table 311P).

As shown in table 311P, the value of only one of voltages $VP1_0$, $VP1_1$, $VP1_2$, $VP1_3$, and $VP1_4$ may change responsive to the change from one select information to the next select information (e.g., next delay code). For example, from row 330 to row 331, responsive to select information changing from $SEL\_P1_0$ (row 330) to $SEL\_P1_1$ (row 331), the value of only voltage $VP1_0$ changes (from $VP_{TAP\_0}$ to $VPtap_1$) while the values of voltages $VP1_1$, $VP1_2$, $VP1_3$, and $VP1_4$ remain unchanged (e.g., at $VP_{TAP\_0}$). In another example, from row 331 to row 332 responsive to select information changing from $SEL\_P1_1$ (row 331) to $SEL\_P1_2$ (row 332), the value of only voltage $VP1_1$ is changed (from $VP_{TAP\_0}$ to $VP_{TAP\_1}$) while the values of voltage $VP1_0$ remains unchanged (at $VPtap_1$) and voltages $VP1_2$, $VP1_3$, and $VP1_4$ remain unchanged (at $VP_{TAP\_0}$).

Thus, as shown in table 311P, voltages (bias voltages) $VP1_0$, $VP1_1$, $VP1_2$, $VP1_3$, and VP4 can have an equal value (e.g., the value corresponding to voltage $VP_{TAP\_0}$ in row 330). Alternatively, at least two of the voltages $VP1_0$, $VP1_1$, $VP1_2$, $VP1_3$, and VP4 can have unequal values. For example, in row 331, voltages $VP1_0$ and $VP1_1$ can have unequal values (e.g., the values corresponding to voltage $VP_{TAP\_0}$ and $VP_{TAP\_1}$, respectively). Configuring (e.g., setting) the values of $VP_{TAP\_0}$ through $VP_{TAP\_X}$ as shown in table 311P can allow sufficient delay range and step (e.g., fine step) to be achieved for the stages (e.g., stage 111, 112, and 113 of FIG. 1) of clock signal adjustment circuit 101 (FIG. 1).

FIG. 3B is a table 312P showing examples of different combinations of voltages $VP_{TAP\_0}$ through $VP_{TAP\_X}$ provided to the gates of transistors $P_0$ through $P_N$ of stage 112 of FIG. 1 as voltages $VP2_0$, $VP2_1$, $VP2_2$, VP2.3, and $VP2_4$ (where N=4 for example) in FIG. 3B. Voltages $VP_{TAP\_0}$, $VP_{TAP\_1}$, $VP_{TAP\_2}$, $VP_{TAP\_3}$, and $VP_{TAP\_X}$ are the same as those in table 311P. However, voltages $VP_{TAP\_0}$ through $VP_{TAP\_X}$ in table 312P are selected by multiplexer 212P based on the value of select information $SEL\_P2_0$, $SEL\_P2_1$, and $SEL\_P2_2$ through $SEL\_P2_M$. Like table 311P (FIG. 3A), FIG. 3B shows only some of the select information and associated tap voltages. As shown in FIG. 3B, voltages $VP2_0$, $VP2_1$, $VP2_2$, $VP2_3$, and $VP2_4$ can change from one combination (e.g., one set) of values (among $VP_{TAP\_0}$ through $VP_{TAP\_X}$) to another combination (e.g., another set) of values (among $VP_{TAP\_0}$ through $VP_{TAP\_X}$) responsive to the change in select information $SEL\_P2_0$ through $SEL\_P2_M$. Although voltages $VP_{TAP\_0}$ through $VP_{TAP\_X}$ in table 312P can be configured (e.g., set) in the same way as that of table 311P, select information (one of $SEL\_P2_0$ through $SEL\_P2_M$) provided to multiplexer 212P can be different from select information (one of $SEL\_P1_0$ through $SEL\_P1_M$) provided to multiplexer 211P during the operation of clock signal adjustment circuit 101 (FIG. 1). Thus, the combination of voltages $VP_{TAP\_0}$ through $VP_{TAP\_X}$ (one of the rows in table 312P) provided as voltages $VP2_0$, $VP2_1$, $VP2_2$, $VP2_3$, and $VP2_4$ to transistors $P_0$ through $P_N$ of stage 112 during the operation of clock signal adjustment circuit 101 may be different from the combination of voltages $VP_{TAP\_0}$ through $VP_{TAP\_X}$ (one of the rows in table 311P) provided as voltages $VP1_0$, $VP1_1$, $VP1_2$, $VP1_3$, and $VP1_4$ to transistors $P_0$ through $P_N$ of stage 111.

FIG. 3C is a table 313P showing examples of different combinations of voltages $VP_{TAP\_0}$ through $VP_{TAP\_X}$ provided to the gates of transistors $P_0$ through $P_N$ (not shown) of stage 113 (FIG. 1) as voltages $VPi_0$, $VPi_1$, $VPi_2$, VPi.3, and $VPi_4$ (where N=4 for example). Voltages $VP_{TAP\_0}$, $VP_{TAP\_1}$, $VP_{TAP\_2}$, $VP_{TAP\_3}$, and $VP_{TAP\_X}$ are the same as those in tables 311P and 312P. However, voltages $VP_{TAP\_0}$ through $VP_{TAP\_X}$ in table 313P are selected by multiplexer 213P based on the value of select information $SEL\_Pi_0$ through $SEL\_Pi_M$. In operation, select information (one of $SEL\_Pi_0$ through $SEL\_Pi_M$) provided to multiplexer 213P can be different from (or the same as) select information provided to multiplexer 211P and multiplexer 212P. Thus, the combination of voltages $VP_{TAP\_0}$ through $VP_{TAP\_X}$ (one of the rows in table 313P) provided as voltages $VPi_0$, $VPi_1$, $VPi_2$, $VPi_3$, and $VPi_4$ to stage 113 during the operation of clock signal adjustment circuit 101 may be different from (or the same as) the combination of voltages $VP_{TAP\_0}$ through $VP_{TAP\_X}$ provided to stage 111 and stage 112.

Voltages $VN_{TAP\_0}$ through $VN_{TAP\_X}$ can be selected (by select circuit 210N of FIG. 2B) and provided to the gates of transistors $N_0$ through $N_N$ stages 111, 112, and 113 in a similar manner as tap voltages $VN_{TAP\_0}$ through $VN_{TAP\_X}$ provided to the gates of transistors $N_0$ through $N_N$ in each of stages 111, 112, and 113. For simplicity, only tap voltages $VN_{TAP\_0}$ through $VN_{TAP\_X}$ provided to the gates of transistors $N_0$ through $N_N$ in stage 111 are described below with reference to FIG. 3D.

FIG. 3D is a table 311N showing examples of different combinations of voltages $VN_{TAP\_0}$ through $VN_{TAP\_X}$ provided to the gates of transistors $N_0$ through $N_N$ of stage 111 of FIG. 1 as voltages $VN1_0$, $VN1_1$, $VN1_2$, $VN1_3$, and $VN1_4$ (where N=4 for example). Voltages $VN_{TAP\_0}$, $VN_{TAP\_1}$, $VN_{TAP\_2}$, $VN_{TAP\_3}$, and $VN_{TAP\_X}$ are the voltages (tap voltages) at nodes 220N (FIG. 2B) selected by multiplexer 211N based on the value of select information $SEL\_N1_0$, $SEL\_N1_1$, and $SEL\_N1_2$ through $SEL\_N1_M$. For simplicity, FIG. 3D shows only some of the select information and associated tap voltages.

As shown in FIG. 3D, each select information (e.g., $SEL\_N1_0$ through $SEL\_N1_M$) can be associated with a different combination of $VN_{TAP\_0}$ through $VN_{TAP\_X}$ (FIG. 3D) to be provided the gates of transistors $N_0$ through $N_N$ voltages $VN1_0$, $VN1_1$, $VN1_2$, $VN1_3$, and $VN1_4$. Voltages $VN1_0$, $VN1_1$, $VN1_2$, $VN1_3$, and $VN1_4$ can change from one combination (e.g., one set) of values (among $VN_{TAP\_0}$ through $VN_{TAP\_X}$) to another combination (e.g., another set) of values (among $VN_{TAP\_0}$ through $VN_{TAP\_X}$) responsive to the change in the select information. For example, voltages $VN1_0$, $VN1_1$, $VN1_2$, $VN1_3$, and $VN1_4$ can change from (row 340) $VN_{TAP\_0}$, $VN_{TAP\_0}$, $VN_{TAP\_0}$, $VN_{TAP\_0}$, and $VN_{TAP\_0}$ to (row 341) $VN_{TAP\_0}$, $VN_{TAP\_0}$, $VN_{TAP\_0}$, $VN_{TAP\_0}$, and $VN_{TAP\_1}$ responsive to select information changing from $SEL\_N1_0$ (row 330) to $SEL\_N1_1$ (row 331).

In another example, voltages $VN1_0$, $VN1_1$, $VN1_2$, $VN1_3$, and $VN1_4$ can change from (row 341) $VN_{TAP\_0}$, $VN_{TAP\_0}$, $VN_{TAP\_0}$, $VN_{TAP\_0}$, and $VN_{TAP\_1}$ to (row 342) $VN_{TAP\_0}$, $VN_{TAP\_0}$, $VN_{TAP\_0}$, $VN_{TAP\_1}$, and $VN_{TAP\_1}$ responsive to select information changing from $SEL\_N1_1$ (row 331) to $SEL\_N1_2$ (row 342).

Voltage $VN_{TAP\_0}$ can be greater than each of voltages $VN_{TAP\_1}$ through $VN_{TAP\_X}$. For example, voltage $VN_{TAP\_0}$ can be close to V1-|VGS(P3)|. Voltage $VN_{TAP\_1}$ can be voltage $VN_{TAP\_0}$-VNdelta (where VNdelta is a relatively small amount of voltage). Voltage $VN_{TAP\_2}$ can be voltage $VN_{TAP\_1}$-VNdelta, and so on. In this example, a particular transistor (e.g., one of transistors $N_0$ through $N_N$) provided with voltage $VN_{TAP\_1}$ can generate more current (higher current) than that particular transistor when it is provided with voltage $VN_{TAP\_0}$. Similarly, a particular transistor provided with voltage $VN_{TAP\_2}$ can generate more current (higher current) than that particular transistor when it is provided with voltage $VN_{TAP\_1}$. A higher current of the transistor provides a lower delay. A lower delay (associated with the high current of transistors $N_0$ through $N_N$) can cause an edge (e.g., the falling edge) of the clock signal (e.g., clock signal CLK1) to occur earlier relative to (e.g., to the left) a reference timing point.

In table 311N in FIG. 3D, the value of select information $SEL\_N1_0$ through $SEL\_N1_M$ can be set to change from a lower value (e.g., lower digital code value) to a higher value (e.g., higher digital code value). Thus, as shown in table 311N, the delay can decrease in the direction from row 340 to 342 (from top to bottom of table 311N)

As shown in table 311N, the value of only one of the voltages $VN1_0$, $VN1_1$, $VN1_2$, $VN1_3$, and $VN1_4$ may change responsive to the change from one select information to the next select information. For example, from row 340 to row 341, responsive to select information changing from $SEL\_N1_0$ (row 340) to $SEL\_N1_1$ (row 341), the value of only voltage $VN1_0$ changes (from $VN_{TAP\_0}$ to $VNtap_1$) while the values of voltages $VN1_1$, $VN1_2$, $VN1_3$, and $VN1_4$ remain unchanged (e.g., at $VN_{TAP\_0}$). In another example, from row 341 to row 342 responsive to select information changing from $SEL\_N1_1$ (row 341) to $SEL\_N1_2$ (row 342), the value of only voltage $VN1_1$ is changed (from $VN_{TAP\_0}$ to $VNtap_1$) while the values of voltage $VN1_0$ remains unchanged (at $VNtap_1$) and voltages $VN1_2$, $VN1_3$, and $VN1_4$ remain unchanged (at $VN_{TAP\_0}$).

Thus, as shown in table 311N, voltages (bias voltages) $VN1_0$, $VN1_1$, $VN1_2$, $VN1_3$, and $VN_4$ can have an equal value (e.g., the value corresponding to voltage $VN_{TAP\_0}$ in row 340). Alternatively, at least two of the voltages $VN1_0$, $VN1_1$, $VN1_2$, $VN1_3$, and $VN_4$ can have unequal values. For example, in row 341, voltages $VN1_0$ and $VN1_1$ can have unequal values (e.g., the values corresponding to voltage $VN_{TAP\_0}$ and $VN_{TAP\_1}$, respectively). Configuring (e.g., setting) the values of $VN_{TAP\_0}$ through $VN_{TAP\_X}$ as shown in table 311N, can allow sufficient delay range and step (e.g., fine step) can be achieved for the stages (e.g., stage 111, 112, and 113) of clock signal adjustment circuit 101.

Figures 4A, 4B, 4C:
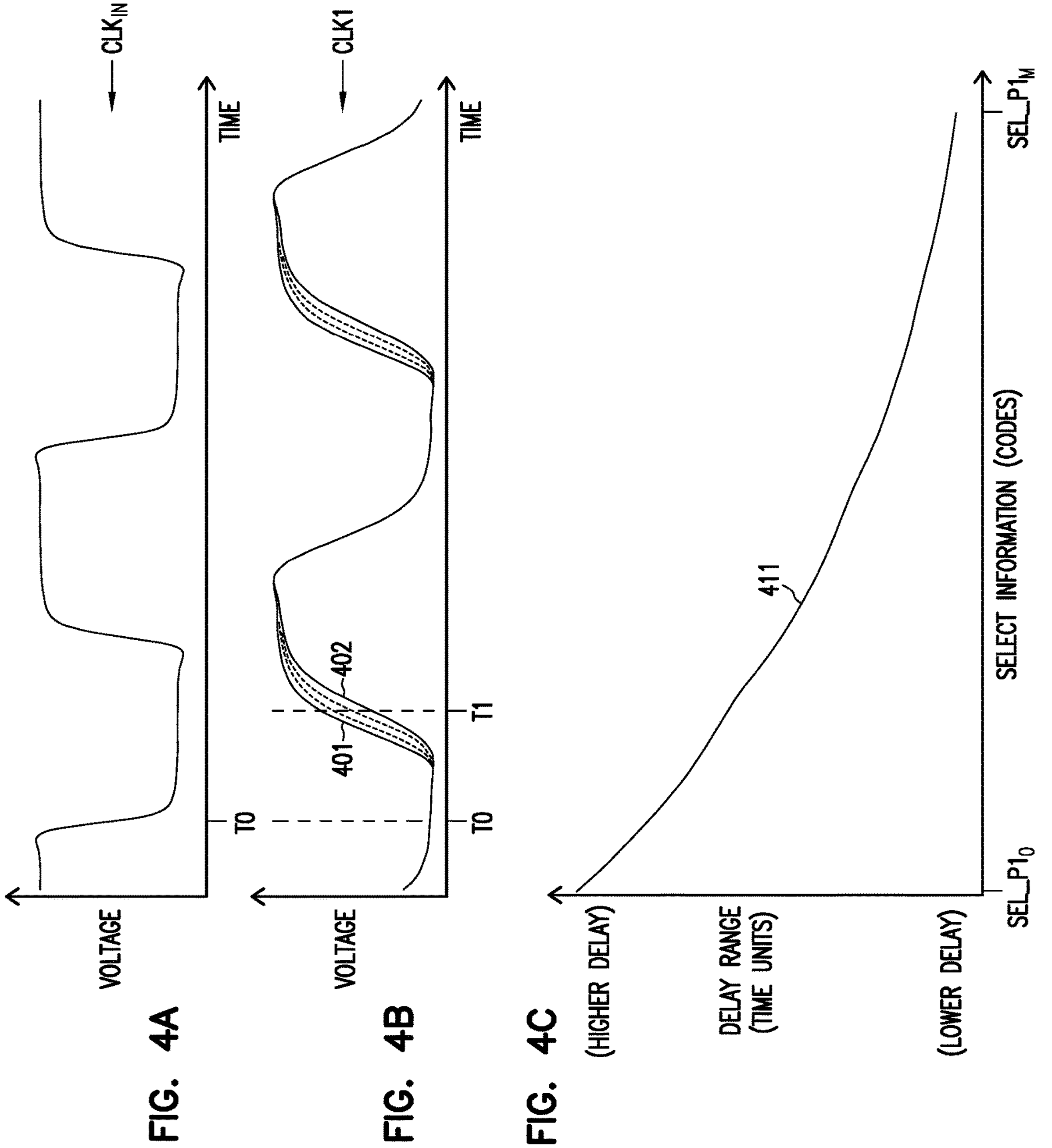
FIG. 4A and FIG. 4B show example waveforms of clock signals at the input and output of one of the stages of the clock signal adjustment circuit of FIG. 1, according to some embodiments described herein.
FIG. 4C shows a curve representing a relationship (e.g., delay profile) between delay (time delay in time units) and select information (e.g., delay codes) for a clock signal of the clock signal adjustment circuit of FIG. 1.

FIG. 4A and FIG. 4B show example waveforms of clock signals $CLK_{IN}$ and CLK1 at respective input (IN) and output (OUT) of stage 111 of FIG. 1. Clock signal CLK1 can have rising edge (at or near time T1) in response to a falling edge (at time T0) of clock signal $CLK_{IN}$. As shown in FIG. 4B, rising edge 401 can occur earlier than time T1 (e.g., reference timing point). Edge 402 can occur later than time T1. In FIG. 4B, clock signal CLK1 can be adjusted such that its rising edge can be one of rising edge 401, rising edge 402, and other rising edges (shown in dashed lines) between rising edges 401 and 402. In the example of FIG. 4B, the delay range associated with the rising edge of the clock signal CLK1 can be the range of time delay between rising edges 401 and 402. Rising edges 401 and 402 can be selecting the values for voltages $VP1_0$ through $VP1_N$ based on table 311P.

FIG. 4C shows a curve 411 representing a relationship (e.g., delay profile) between delay (time delay in time units) and select information (delay codes) for a clock signal (e.g., clock signal CLK1 in FIG. 4B) of clock signal adjustment circuit 101. As shown in FIG. 4C, the delay range can include a lower delay (lower amount of time delay) and a higher delay (higher amount of time delay). Select information can be changed (varied) from select information $SEL\_P1_0$ to select information $SEL\_P1_M$. In the example of FIG. 4C, select information $SEL\_P1_0$ can have a lesser (e.g., minimum) value relative to select information $SEL\_P1_M$, which can have a greater value (e.g., maximum value). As can be seen from FIG. 4C, curve 411 has a relatively linear profile, which indicates that the relationship between the delay and the values of the select information is near linear. The linear relationship can improve the delay range and step in each stage (e.g., stages 111, 112, and 113) of clock signal adjustment circuit 101.

Figure 5:
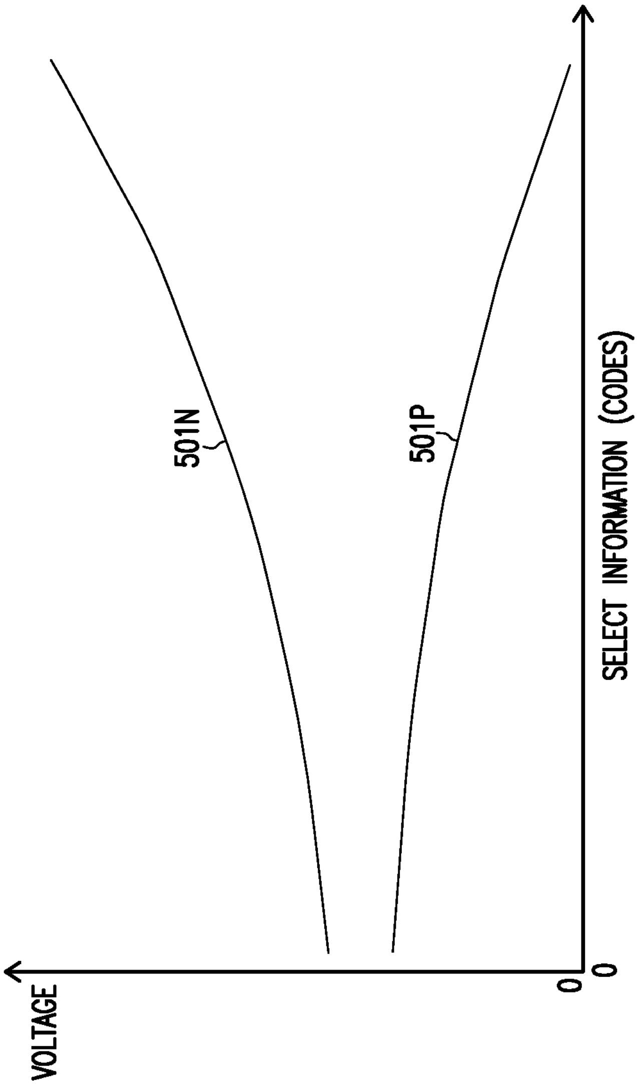
FIG. 5 shows an example relationship between average bias voltages and select information for one of the stages of the clock signal adjustment circuit of FIG. 1, according to some embodiments described herein.

FIG. 5 shows an example relationship between average bias voltages provided to the gates of transistors $P_0$ through $P_N$ and $N_0$ through $N_N$ and select information (e.g., select information $SEL\_P1_0$ through $SEL\_P1_M$) of one of the stages (e.g., stage 111) of clock signal adjustment circuit 101 of FIG. 1. The average of voltages provided to the gates of transistors $P_0$ through $P_N$ a stage (e.g., stage 111) of FIG. 1 can be calculated by summing the values of the bias voltages (e.g., $VP1_0$ through $VP1_N$) divided by the number of transistors $P_0$ through $P_N$ of the stage. The average of voltages provided to the gates of transistors $N_0$ through $N_N$ in a stage (e.g., stage 111) of FIG. 1 can be calculated by summing the values of the bias voltages (e.g., $VN1_0$ through $VN1_N$) divided by the number of transistors No through $N_N$ of the stage.

In FIG. 5, curve 501P shows the average behavior of the transistors $P_0$ through $P_N$ of a stage (e.g., stage 111) of clock signal adjustment circuit 101 responsive to select information (e.g., select information $SEL\_P1_0$ through $SEL\_P1_M$) changing from a lesser value to a greater value. Curves 501N shows the average behavior of the transistors $N_0$ through $N_N$ of a stage (e.g., stage 111) of clock signal adjustment circuit 101 responsive to select information (e.g., select information $SEL\_N1_0$ through $SEL\_N1_M$) changing from a lesser value to a greater value. To have a linear delay profile, as shown by curve 411 in FIG. 4C, the bias voltages provided to the gates transistors $P_0$ through $P_N$ and $N_0$ through $N_N$ can be changed (varied) in a non-linear (e.g., a square) manner.

Figure 6:
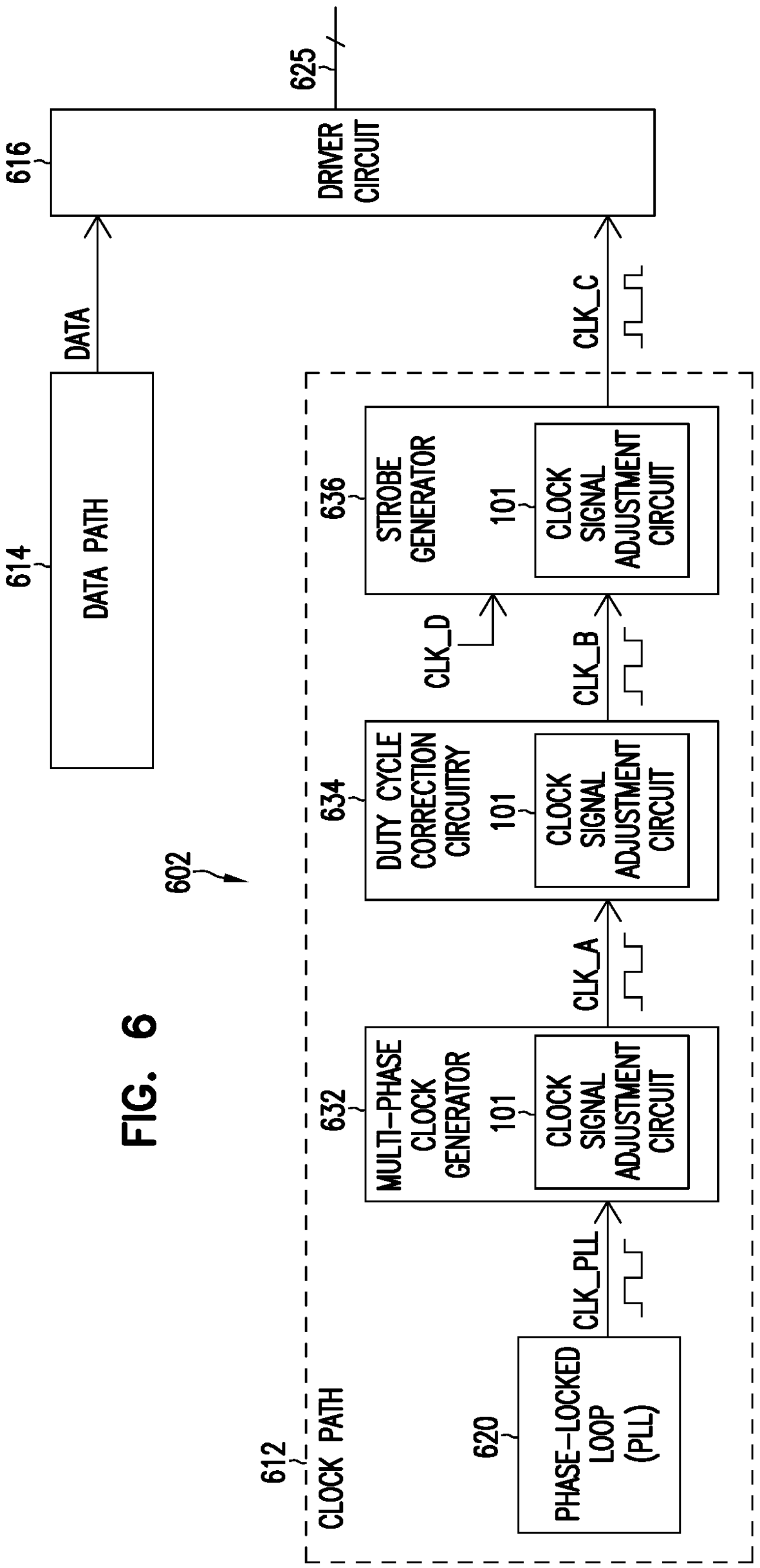
FIG. 6 shows an apparatus in the form of a device, including a clock path, a data path, and a driver, according to some embodiments described herein.

FIG. 6 shows an apparatus in the form of a device 602, including a clock path 612, a data path 614, and a driver 616, according to some embodiments described herein. In an example, device 602 can include a communication interface (e.g., serializer/Deserializer (SerDes), not shown) circuitry in which at least part of clock path 612, data path 614, and driver 616 can be included in a transmitter, a receiver, or both, of the communication interface circuitry. Device 602 can include or be included in (e.g., formed in or formed on) an integrated circuit (IC) die (or IC chip). The IC die can include or be included in a system-on-chip (SoC). The SoC may or may not include a communication interface for wireless communication. For example, the SoC may or may not include a communication interface for an antenna (or antennas). Alternatively, the IC die does not have to be a system-on-chip. The IC die can also be included in a system in a package (SiP), or other electronic devices. The SoC or SoP can include at least one controller (e.g., processors (e.g., central processing unit (CPU)), input/output controllers, memory controllers, a memory device, and other electronic devices.

In FIG. 6, driver 616 can operate to receive information DATA (e.g., data information) from data path 614 based on timing of a strobe signal CLK_C from clock path 612. Information DATA can be provided from an internal part of device 602 or alternatively from a device or system external from device 602. Driver 616 can pass information DATA to other part internally in device 602 for further processing or externally to device 602.

As shown in FIG. 6, clock path 612 can include a phase-locked loop (PLL) 620 to generate a clock signal (e.g., PLL output clock signal) CLK_PLL at its output. Other timing signals, which include clock signals CLK_A and CLK_B, and strobe signal CLK_C) can be generated based on the clock signal CLK_PLL. Clock signals CLK_A and CLK_B, and strobe signal CLK_C can have the same frequency as clock signal CLK_PLL.

Clock path 612 can include a multi-phase clock generator 632, duty-cycle correction circuitry 634, and a strobe generator 636, each of which can include clock signal adjustment circuit 101. The structure and operation of clock signal adjustment circuit 101 are described in detail above with reference to FIG. 1 through FIG. 5.

Multi-phase clock generator 632 can include an input coupled to the output of PLL 620 to receive clock signal CLK_PLL and generate multiple clock signals (e.g., quadrature clock signals) having different phases based on clock signal CLK_PLL. One of the multiple clock signals (e.g., one of the quadrature clock signals) is shown in FIG. 6 as clock signal CLK_A. As shown in FIG. 6, multi-phase clock generator 632 can include clock signal adjustment circuit 101 (as described above with reference to FIG. 1 through FIG. 5) to adjust the timing (e.g., the rising edge, falling edge, or both) of clock signal CLK_A (e.g., based on a timing specification). Clock signal CLK_A can correspond to clock signal $CLK_{OUT}$ (FIG. 1).

Duty-cycle correction circuitry 634 can operate to correct the duty cycle of a clock signal CLK_B, which can be generated based on clock signal CLK_A. Clock signal adjustment circuit 101 of duty-cycle correction circuitry 634 can operate to adjust the timing (e.g., the rising edge or falling edge,) of clock signal CLK_B to correct the duty cycle of a clock signal CLK_B (e.g., based on duty cycle specification). Clock signal CLK_B can correspond to clock signal $CLK_{OUT}$ (FIG. 1).

Strobe generator 636 can operate to generate strobe signal CLK_C, which can have a duty cycle different from 50% duty cycle (e.g., a duty cycle of 25% or 75%). Strobe signal CLK can be generated based a combination of clock signal CLK_B and a clock signal CLK_D. Clock signal adjustment circuit 101 of strobe generator 636 can be part of a phase alignment circuit (not shown) of strobe generator 636. Clock signal adjustment circuit 101 of strobe generator 636 can operate to adjust the timing of strobe signal CLK_C as part of the phase alignment function of the phase alignment circuit (e.g., to align the timing of strobe signal CLK_C with other strobe signals (not shown) generated by strobe generator 636. Strobe signal CLK_C can correspond to clock signal $CLK_{OUT}$ (FIG. 1). However, strobe signal CLK_C can have a duty cycle different from 50% duty cycle (e.g., a duty cycle of 25% or 75%).

Including clock signal adjustment circuit 101 in clock path 612 as shown in FIG. 6 can improve (e.g., increase timing accuracy of) clock signals CLK_A and CLK_B, and strobe signal CLK_C and improve (e.g., reduce) power consumption of clock path 612. Including clock signal adjustment circuit 101 in clock path 612 can also improve (e.g., reduce) random jitter. In an example, the stages (e.g., stages 111, 112, and 113 in FIG. 1) of each clock signal adjustment circuit 101 in clock path 612 can be calibrated (e.g., set) with relatively greater value for selection information (delay code values) to provide lower delay to further improve jitter performance of multi-phase clock generator 632, duty-cycle correction circuitry 634, and strobe generator 636.

Device 602 can be included in another device or system that has a communication module for wired or wireless communication. For example, device 602 can be included in a system that can include at least one an antenna to allow the system to communicate wirelessly with another device or system. In another example, device 602 can be included in a system that does not have to include an antenna (or antennas). Such wireless communication may include communication in accordance with WiFi communication technique, Long Term Evolution Advanced (LTE-A) communication technique, or other communication techniques.

Device 602 can act as low jitter, low power, high frequency, high performance clock path in the transmitter or receiver of one or more of the following standards or specifications (e.g., I/O standards or specifications), including Universal Serial Bus (USB), DisplayPort (DP), High-Definition Multimedia Interface (HDMI), Thunderbolt, Peripheral Component Interconnect Express (PCIe), Ethernet, and other specifications.

As shown in FIG. 6, device 602 can include a connection 625 coupled to driver 616. Connection 625 can include wireline connections (e.g., a conductive bus). Connection 625 can include conductive lines that conform with at least one of USB, DP, HDMI, Thunderbolt, PCIe, Ethernet, and other specifications.

The illustrations of the apparatuses (e.g., clock signal adjustment circuit 101, voltage generators 201P and 201N, and device 602) described above with reference to FIG. 1 through FIG. 6 are intended to provide a general understanding of the structure of different embodiments and are not intended to provide a complete description of all the elements and features of an apparatus that might make use of the structures described herein.

The apparatuses and methods described above can include or be included in high-speed computers, communication and signal processing circuitry, single-processor module or multi-processor modules, single embedded processors or multiple embedded processors, multi-core processors, message information switches, and application-specific modules including multilayer or multi-chip modules. Such apparatuses may further be included as sub-components within a variety of other apparatuses (e.g., electronic systems), such as televisions, cellular telephones, personal computers (e.g., laptop computers, desktop computers, handheld computers, etc.), tablets (e.g., tablet computers), workstations, radios, video players, audio players (e.g., MP3 (Motion Picture Experts Group, Audio Layer 3) players), vehicles, medical devices (e.g., heart monitors, blood pressure monitors, etc.), set top boxes, and others.

In the detailed description and the claims, the terms "first", "second", and "third", etc. are used merely as labels, and are not intended to impose numerical requirements on their objects.

In the detailed description and the claims, a list of items joined by the term "one of" can mean only one of the listed items. For example, if items A and B are listed, then the phrase "one of A and B" means A only (excluding B), or B only (excluding A). In another example, if items A, B, and C are listed, then the phrase "one of A, B, and C" means A only, B only, or C only. Item A can include a single element or multiple elements. Item B can include a single element or multiple elements. Item C can include a single element or multiple elements.

In the detailed description and the claims, a list of items joined by the term "at least one of" can mean any combination of the listed items. For example, if items A and B are listed, then the phrase "at least one of A and B" means A only, B only, or A and B. In another example, if items A, B, and C are listed, then the phrase "at least one of A, B, and C" means A only; B only; C only; A and B (excluding C); A and C (excluding B); B and C (excluding A); or all of A, B, and C. Item A can include a single element or multiple elements. Item B can include a single element or multiple elements. Item C can include a single element or multiple elements.

Additional Notes and Examples

Example 1 includes subject matter (such as a device, an electronic apparatus (e.g., circuit, electronic system, or both), or a machine) including a first node; a second node; a first transistor and a second transistor, the first and second transistors including a common gate coupled to the node and a common terminal coupled to the second node; first additional transistors coupled in parallel with each other between a terminal of the first transistor and a first supply node, the first additional transistors including gates; and second additional transistors coupled in parallel with each other between a terminal of the second transistor and a second supply node, the second additional transistors including gates.

In Example 2, the subject matter of Example 1 may optionally include, further comprising a third transistor and a fourth transistor, the third and fourth transistors including a common gate coupled to the second node and a common terminal coupled to couple to a third node to provide a third clock signal at the third node based on the second clock signal, third additional transistors coupled in parallel with each other between a terminal of the third transistor and the first supply node, the third additional transistors including gates to receive respective third voltages, and fourth additional transistors coupled in parallel with each other between a terminal of the fourth transistor and the second supply node, the fourth additional transistors including gates to receive respective fourth voltages.

In Example 3, the subject matter of Example 1 may optionally include, wherein the first and second transistors have different transistor types.

In Example 4, the subject matter of Example 1 may optionally include, wherein the first additional transistors have a first transistor type, and the second additional transistors have a second transistor type.

In Example 5, the subject matter of Example 1 may optionally include, the first node is to receive a first clock signal, the first and second transistors are to receive the first clock signal and to provide a second clock signal at the second node based on the first clock signal, the gates of the first additional transistors are to receive respective first voltages at the gates, and the gates of the second additional transistors are receive respective second voltages.

In Example 6, the subject matter of Example 5 may optionally include, wherein at least two of the respective first voltages have unequal values.

In Example 6, the subject matter of Example 5 may optionally include, wherein the respective first voltages have an equal value.

In Example 8, the subject matter of Example 5 may optionally include, wherein at least two of the respective second voltages have unequal values.

In Example 9, the subject matter of Example 5 may optionally include, wherein the respective second voltages have an equal value.

In Example 10, the subject matter of Example 5 may optionally include, wherein at least one of the respective first voltages has a value unequal to a value of at least one of the second voltages.

In Example 11, the subject matter of Example 5 may optionally include, further comprising an inverter to provide an output clock signal based on the second clock signal.

In Example 12, the subject matter of Example 1 may optionally include, further comprising a data path, a clock path to generate at least one of a clock signal and a strobe signal, and a driver to receive data from the data path based on timing of the at least one of the clock signal and the strobe signal, the clock path including a clock signal adjustment circuit, wherein the clock signal adjustment circuit includes the first and second transistors, the first additional transistors, and the second additional transistors.

In Example 13, the subject matter of Example 12 may optionally include, wherein the clock path includes at least one of a multi-phase clock generator to generate clock signals having different phases, duty-cycle correction circuitry, a strobe generator to generate the strobe signal, and wherein the clock signal adjustment circuit is included in at least one of the multi-phase clock generator, the duty-cycle correction circuitry, and the strobe generator.

In Example 14, the subject matter of Example 13 may optionally include, wherein the clock path includes phase-locked loop having an output coupled to an input of the multi-phase clock generator.

In Example 15, the subject matter of Example 1 may optionally include, wherein the apparatus includes a system-on-chip.

In Example 16, the subject matter of Example 1 may optionally include, wherein the apparatus includes a system, and the system includes an antenna.

Example 17 includes subject matter (such as a device, an electronic apparatus (e.g., circuit, electronic system, or both), or a machine) including a node to receive an input clock signal, and stages coupled in series with the node, the stages including a first stage and a second stage coupled to the first stage, the first stage including an input to receive the input clock signal and an output to provide a first clock signal based on the input clock signal, the second stage including an input to receive the first clock signal and an output to provide a second clock signal based on the first clock signal, wherein the first stage includes a first transistor and a second transistor, the first and second transistors including a common gate coupled to the input of the first stage and a common terminal coupled to the output of the first stage, first additional transistors coupled in parallel with each other between a terminal of the first transistor and a first supply node, and second additional transistors coupled in parallel with each other between a terminal of the second transistor and a second supply node, a first voltage generator having outputs to provide first voltages, a first multiplexer including inputs coupled to the outputs of the first voltage generator and outputs coupled to respective gates of the first additional transistors, a second voltage generator having outputs to provide second voltages, and a second multiplexer including inputs coupled to the outputs of the second voltage generator and outputs coupled to respective gates of the second additional transistors.

In Example 18, the subject matter of Example 17 may optionally include, wherein the first voltage generator includes a first resistor ladder, and the outputs of the first voltage generator are coupled to different nodes of the first resistor ladder, and the second voltage generator includes a second resistor ladder, and the outputs of the second voltage generator are coupled to different nodes of the second resistor ladder.

In Example 19, the subject matter of Example 18 may optionally include, wherein the different nodes of the first resistor ladder are to provide non-linear voltages.

In Example 20, the subject matter of Example 18 may optionally include, wherein the different nodes of the second resistor ladder are to provide non-linear voltages.

In Example 21, the subject matter of Example 17 may optionally include, wherein the first supply node is to receive a first voltage, the second supply node is to receive a second voltage less than the first voltage, the first additional transistors include p-type transistors, and the second additional transistors include n-type transistors.

In Example 22, the subject matter of Example 17 may optionally include, wherein the second stage includes a third transistor and a fourth transistor, the third and fourth transistors including a common gate coupled to the input of the second stage and a common terminal coupled to the output of the second stage, third additional transistors coupled in parallel with each other between a terminal of the third transistor and the first supply node, fourth additional transistors coupled in parallel with each other between a terminal of the fourth transistor and the second supply node, a third multiplexer including inputs coupled to the outputs of the first voltage generator and outputs coupled to respective gates of the third additional transistors, and a fourth multiplexer including inputs coupled to the outputs of the second voltage generator and outputs coupled to respective gates of the fourth additional transistors.

Example 23 includes subject matter (such as a method of operating a device, an electronic apparatus (e.g., circuit, electronic system, or both), or a machine) including providing a clock signal to a common gate of a first transistor and a second transistor, providing first voltages to respective gates of first additional transistors coupled in parallel with each other between a terminal of the first transistor and a first supply node, and providing second voltages to respective gates of second additional transistors coupled in parallel with each other between a terminal of the second transistor and a second supply node.

In Example 24, the subject matter of Example 23 may optionally include, further comprising providing an additional clock signal from a common terminal of the first and second transistors to a common gate of a third transistor and a fourth transistor, providing third voltages to respective gates of third additional transistors coupled in parallel with each other between a terminal of the third transistor and the first supply node, and providing fourth voltages to respective gates of fourth additional transistors coupled in parallel with each other between a terminal of the fourth transistor and the second supply node.

In Example 25, the subject matter of Example 24 may optionally include, further comprising generating fifth voltages at a first resistor ladder, generating sixth voltages at a second resistor ladder, selecting from among the fifth voltages to provide the first voltages, selecting from among the sixth voltages to provide the second voltages, selecting from among the fifth voltages to provide the third voltages, and selecting from among the sixth voltages to provide the fourth voltages.

The subject matter of Example 1 through Example 25 may be combined in any combination.

The above description and the drawings show some embodiments to enable those skilled in the art to practice the embodiments of the inventive subject matter. Other embodiments may incorporate structural, logical, electrical, process, and other changes. Examples merely typify possible variations. Portions and features of some embodiments may be included in, or substituted for, those of other embodiments. Many other embodiments will be apparent to those skilled in the art upon reading and understanding the above description. Therefore, the scope of various embodiments is determined by the appended claims, along with the full range of equivalents to which such claims are entitled.

What is claimed is:

1. An apparatus comprising:

a first node;

a second node;

a first transistor and a second transistor, the first and second transistors including a common gate coupled to the first node and a common terminal coupled to the second node;

first additional transistors coupled in parallel with each other between a terminal of the first transistor and a first supply node, the first additional transistors including gates;

second additional transistors coupled in parallel with each other between a terminal of the second transistor and a second supply node, the second additional transistors including gates;

a first voltage generator having outputs to provide first voltages;

a first multiplexer including inputs coupled to the outputs of the first voltage generator and outputs coupled to respective gates of the first additional transistors;

a second voltage generator having outputs to provide second voltages; and a second multiplexer including inputs coupled to the outputs of the second voltage generator and outputs coupled to respective gates of the second additional transistors.

2. The apparatus of claim 1, further comprising;

a third transistor and a fourth transistor, the third and fourth transistors including a common gate coupled to the second node and a common terminal coupled to couple to a third node to provide a third clock signal at the third node based on a second clock signal;

third additional transistors coupled in parallel with each other between a terminal of the third transistor and the first supply node, the third additional transistors including gates to receive respective third voltages; and fourth additional transistors coupled in parallel with each other between a terminal of the fourth transistor and the second supply node, the fourth additional transistors including gates to receive respective fourth voltages.

3. The apparatus of claim 1, wherein first and second transistors have different transistor types.

4. The apparatus of claim 1, wherein the first additional transistors have a first transistor type, and the second additional transistors have a second transistor type.

5. The apparatus of claim 1, wherein:

the first node is to receive a first clock signal;

the first and second transistors are to receive the first clock signal and to provide a second clock signal at the second node based on the first clock signal;

the gates of the first additional transistors are to receive respective first voltages at the gates; and the gates of the second additional transistors are to receive respective second voltages.

6. The apparatus of claim 5, wherein at least two of the respective first voltages have unequal values.

7. The apparatus of claim 5, wherein the respective first voltages have an equal value.

8. The apparatus of claim 5, wherein at least two of the respective second voltages have unequal values.

9. The apparatus of claim 5, wherein the respective second voltages have an equal value.

10. The apparatus of claim 5, wherein at least one of the respective first voltages has a value unequal to at least one of the second voltages.

11. The apparatus of claim 5, further comprising an inverter to provide an output clock signal based on the second clock signal.

12. The apparatus of claim 1, further comprising:

a data path;

a clock path to generate at least one of a clock signal and a strobe signal; and a driver to receive data from the data path based on timing of the at least one of the clock signal and the strobe signal, the clock path including a clock signal adjustment circuit, wherein the clock signal adjustment circuit includes the first and second transistors, the first additional transistors, and the second additional transistors.

13. The apparatus of claim 12, wherein the clock path includes at least one of a multi-phase clock generator to generate clock signals having different phases, duty-cycle correction circuitry, a strobe generator to generate the strobe signal, and wherein the clock signal adjustment circuit is included in at least one of the multi-phase clock generator, the duty-cycle correction circuitry, and the strobe generator.

14. The apparatus of claim 13, wherein the clock path includes phase-locked loop having an output coupled to an input of the multi-phase clock generator.

15. The apparatus of claim 1, wherein the apparatus includes a system-on-chip.

16. The apparatus of claim 1, wherein the apparatus includes a system, and the system includes an antenna.

17. An apparatus comprising:

a node to receive an input clock signal; and stages coupled in series with the node, the stages including a first stage and a second stage coupled to the first stage, the first stage including an input to receive the input clock signal and an output to provide a first clock signal based on the input clock signal, the second stage including an input to receive the first clock signal and an output to provide a second clock signal based on the first clock signal, wherein the first stage includes:

a first transistor and a second transistor, the first and second transistors including a common gate coupled to the input of the first stage and a common terminal coupled to the output of the first stage;

first additional transistors coupled in parallel with each other between a terminal of the first transistor and a first supply node; and second additional transistors coupled in parallel with each other between a terminal of the second transistor and a second supply node;

a first voltage generator having outputs to provide first voltages;

a first multiplexer including inputs coupled to the outputs of the first voltage generator and outputs coupled to respective gates of the first additional transistors;

a second voltage generator having outputs to provide second voltages; and a second multiplexer including inputs coupled to the outputs of the second voltage generator and outputs coupled to respective gates of the second additional transistors.

18. The apparatus of claim 17, wherein:

the first voltage generator includes a first resistor ladder, and the outputs of the first voltage generator are coupled to different nodes of the first resistor ladder; and the second voltage generator includes a second resistor ladder, and the outputs of the second voltage generator are coupled to different nodes of the second resistor ladder.

19. The apparatus of claim 18, wherein the different nodes of the first resistor ladder are to provide non-linear voltages.

20. The apparatus of claim 18, wherein the different nodes of the second resistor ladder are to provide non-linear voltages.

21. The apparatus of claim 17, wherein:

the first supply node is to receive a first voltage;

the second supply node is to receive a second voltage less than the first voltage;

the first additional transistors include p-type transistors; and the second additional transistors include n-type transistors.

22. The apparatus of claim 17, wherein the second stage includes:

a third transistor and a fourth transistor, the third and fourth transistors including a common gate coupled to the input of the second stage and a common terminal coupled to the output of the second stage;

third additional transistors coupled in parallel with each other between a terminal of the third transistor and the first supply node;

fourth additional transistors coupled in parallel with each other between a terminal of the fourth transistor and the second supply node;

a third multiplexer including inputs coupled to the outputs of the first voltage generator and outputs coupled to respective gates of the third additional transistors; and a fourth multiplexer including inputs coupled to the outputs of the second voltage generator and outputs coupled to respective gates of the fourth additional transistors.

23. A method comprising:

providing a clock signal to a common gate of a first transistor and a second transistor;

providing first voltages to respective gates of first additional transistors coupled in parallel with each other between a terminal of the first transistor and a first supply node;

providing second voltages to respective gates of second additional transistors coupled in parallel with each other between a terminal of the second transistor and a second supply node;

providing an additional clock signal from a common terminal of the first and second transistors to a common gate of a third transistor and a fourth transistor;

providing third voltages to respective gates of third additional transistors coupled in parallel with each other between a terminal of the third transistor and the first supply node;

providing fourth voltages to respective gates of fourth additional transistors coupled in parallel with each other between a terminal of the fourth transistor and the second supply node;

generating fifth voltages at a first resistor ladder;

generating sixth voltages at a second resistor ladder;

selecting from among the fifth voltages to provide the first voltages;

selecting from among the sixth voltages to provide the second voltages;

selecting from among the fifth voltages to provide the third voltages; and selecting from among the sixth voltages to provide the fourth voltages.

* * * * *